(12) United States Patent
Hellberg

(10) Patent No.: US 10,389,309 B2
(45) Date of Patent: Aug. 20, 2019

(54) AMPLIFIER CIRCUIT AND METHOD

(71) Applicant: TELEFONAKTIEBOLAGET LM ERICSSON (PUBL), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/516,717

(22) PCT Filed: Oct. 6, 2014

(86) PCT No.: PCT/SE2014/051156
§ 371 (c)(1),
(2) Date: Apr. 4, 2017

(87) PCT Pub. No.: WO2016/056952
PCT Pub. Date: Apr. 14, 2016

(65) Prior Publication Data
US 2017/0250658 A1 Aug. 31, 2017

(51) Int. Cl.
*H03F 1/02* (2006.01)
*H03F 3/19* (2006.01)
(Continued)

(52) U.S. Cl.
CPC .......... *H03F 1/0288* (2013.01); *H03F 1/56* (2013.01); *H03F 3/19* (2013.01); *H03F 3/24* (2013.01);
(Continued)

(58) Field of Classification Search
USPC .............. 330/295, 124 R, 84, 286
See application file for complete search history.

(56) References Cited

U.S. PATENT DOCUMENTS 8,274,332 B2 * 9/2012 Cho .................. H03F 1/0261
330/124 R
8,339,201 B1 * 12/2012 Wilson .................. H03F 1/56
330/124 R
(Continued)

FOREIGN PATENT DOCUMENTS

EP 1959563 A2 8/2008
WO 03061115 A1 7/2003
(Continued)

OTHER PUBLICATIONS

Abadi et al., "An Extended Bandwidth Doherty Power Amplifier Using a Novel Output Combiner," 2014 IEEE MTT-S International Microwave Symposium (IMS), Jun. 1-6, 2014, Tampa Bay, FL.
Chireix, "High Power Outphasing Modulation," Proceedings of the Institute of Radio Engineers, Nov. 1935, vol 25, No. 11.
Doherty, "A New High Efficiency Power Amplifier for Modulated Waves," Proceedings of the Institute of Radio Engineers, Sep. 1936, vol. 24, No. 9.
(Continued)

*Primary Examiner* — Hieu P Nguyen
(74) *Attorney, Agent, or Firm* — Patent Portfolio Builders PLLC

(57) ABSTRACT

An amplifier arrangement comprises N amplifier stages comprising a main amplifier stage and a plurality of peaking amplifier stages. A transmission line comprises a varying impedance for transforming a load impedance to a higher impedance at the main amplifier stage, wherein the plurality of peaking amplifiers are coupled at intermediate locations to the transmission line. The amplifier arrangement is configured such that at least two of the peaking amplifiers are collectively driven with time delayed versions of substantially the same signal. The amplifier arrangement may be configured to operate with N−2 or fewer transition points in a Doherty mode of operation. As such, the amplifier arrangement may comprise more amplifier stages than are necessarily required in a Doherty amplifier arrangement having the same number of transition points.

14 Claims, 25 Drawing Sheets

(51) Int. Cl.
  H03F 1/56    (2006.01)
  H03F 3/68    (2006.01)
  H03F 3/60    (2006.01)
  H03F 3/24    (2006.01)
(52) U.S. Cl.
  CPC ....... *H03F 3/605* (2013.01); *H03F 2200/255* (2013.01); *H03F 2200/451* (2013.01)

(56) References Cited

U.S. PATENT DOCUMENTS

| | | | |
|---|---|---|---|
| 8,466,746 B2* | 6/2013 | Jeong | H03F 1/0266 330/124 R |
| 2010/0176885 A1 | 7/2010 | Kim et al. | |

FOREIGN PATENT DOCUMENTS

| | | |
|---|---|---|
| WO | 2010068152 A1 | 6/2010 |
| WO | 2012076924 A1 | 6/2012 |
| WO | 2015057118 A1 | 4/2015 |
| WO | 2016056951 A1 | 4/2016 |

OTHER PUBLICATIONS

Giofre et al., "A distributed matching/combining network suitable for Doherty power amplifiers covering more than an octave frequency band," 2014 IEEE MTT-S International Microwave Symposium (IMS), Jun. 1-6, 2014, Tampa Bay, FL.

Gustafsson et al., "A 44 dBm 1.0-3.0 GHz GaN Power Amplifier with over 45% PAE at 6 dB back-off," 2013 IEEE MTT-S International Microwave Symposium Digest (IMS), Jun. 2-7, 2013, Seattle, WA.

Gustafsson et al., "A Novel Wideband and Reconfigurable High Average Efficiency Power Amplifier," 2012 IEEE MTT-S International Microwave Symposium Digest (MTT), Jun. 17-22, 2012, Montreal, CA.

Piazzon et al., "A Method for designing Broadband Doherty Power Amplifiers," Progress in Electromagnetics Research, 2014, pp. 319-331, vol. 145.

International Search Report and Written Opinion dated Jul. 8, 2015 in related International Application No. PCT/SE2014/051156.

* cited by examiner

AMPLIFIER CIRCUIT AND METHOD

TECHNICAL FIELD

The present invention relates to an amplifier circuit and method, and more particularly to an amplifier circuit and method which provides improved efficiency, for example in an arbitrarily wideband Doherty amplifier arrangement.

BACKGROUND

In radio base stations and other systems, power amplifiers are often used to amplify wideband signals or signal combinations with high peak to average power ratio (PAR or PAPR). The amplifiers must then be able to repeatedly output very high power for very short periods, even though the bulk of the output power is generated at the much lower average power level. In systems with random phase combinations of many signals (without any dominating ones) the amplitude of the signal follows a Rayleigh distribution.

A conventional single-transistor power amplifier (for example a class B, AB or F power amplifier) has a fixed radio frequency (RF) load resistance and a fixed voltage supply. The bias in class B or AB amplifiers causes the output current to have a form close to that of a pulse train of half wave rectified sinusoid current pulses. The direct current (DC) current (and hence DC power) is therefore largely proportional to the RF output current amplitude (and voltage). The output power, however, is proportional to the RF output current squared. The efficiency, i.e. output power divided by DC power, is therefore also proportional to the output amplitude. While efficiency is high at the highest output powers, the average efficiency of a power amplifier is consequently low when amplifying signals that on average have a low output amplitude (or power) compared to the maximum required output amplitude (or power), i.e. high PAR.

A Chireix amplifier (as described in "High power outphasing modulation," Proc. IRE, vol. 23, no. 11, pp. 1370-1392, November 1935, by H Chireix), or a Doherty amplifier (as described in "A new high efficiency power amplifier for modulated waves", by W. H. Doherty, Proc. IRE, vol. 24, no. 9, pp. 1163-1182, September 1936) were the first examples of amplifiers based on multiple transistors with passive output network interaction and combination.

They have high average efficiency for amplitude-modulated signals with high peak-to-average ratio (PAR) since they have a much lower average sum of RF output current magnitudes from the transistors at low amplitudes. This causes high average efficiency since the DC currents drawn by the transistors are largely proportional to the RF current magnitudes.

The reduced average output current is obtained by using two transistors that influence each other's output voltages and currents through a reactive output network (that is also coupled to the load). By driving the constituent transistors with the appropriate amplitudes and phases, the sum of RF output currents is reduced at all levels except the maximum. Also for these amplifiers the RF voltage at one or both transistor outputs is increased.

In 2001 the author of the present application invented two-stage high efficiency amplifiers with increased robustness against circuit variations and with radically increased bandwidth of high efficiency, as disclosed in patent number WO2003/061115 by the present Applicant. A wideband amplifier (100% relative bandwidth, i.e. having a 3:1 high band edge to low band edge ratio) has been successfully implemented by the present Applicant. The central mode of such an amplifier is a wideband Doherty mode.

By designing similar networks with more amplifiers and with transmission line networks with longer maximum electrical length, even wider bandwidths can be achieved, as shown for example in co-pending patent application number PCT/SE2013/051217. These amplifiers have a large total bandwidth of high efficiency even with small numbers of sub-amplifiers, for example even with three or four sub-amplifiers.

Wideband Doherty amplifiers are a subject of much interest, and many approaches have been attempted. For example, using a quarter wavelength transmission line with the same impedance as the load results in wideband efficiency at the transition point, as disclosed in a paper by D Gustafsson et al., entitled "Theory and design of a novel wideband and reconfigurable high average efficiency amplifier, Proc. IMS 2012.

The wideband multistage amplifiers of WO2003/061115 or PCT/SE2013/051217 have different operating modes in different frequency bands, which has the disadvantage of complicating the input drive circuits. The central Doherty mode of WO2003/061115 can be up to about 60% wideband, but the transition point amplitude then varies considerably within the bandwidth.

A Doherty amplifier that has a quarter wavelength line with the same impedance as the load, for example as disclosed in the paper mentioned above by Gustafsson, has the disadvantage of requiring a different supply voltage to each of the two sub-amplifiers. This results in an oversized and underutilized main transistor in case the same technology is used for both sub-amplifiers. The wideband efficiency at the transition point is obtained by sacrificing both wideband transistor utilization and efficiency at maximum power, which reduces the bandwidth of high average efficiency as well as increases transistor cost.

Using an LC-resonator, for example as disclosed in a paper by M Naseri Ali Abadi et al., entitled "An Extended Bandwidth Doherty Power Amplifier using a Novel Output Combiner", Proc. IMS 2014, or using a resonant stub at the output node has the drawback of decreasing the full power bandwidth and efficiency bandwidth at full power (as opposed to the technique of WO2003/061115 that does not have this drawback).

Furthermore, using another technique involving the use of a multi-section branch line coupler has limitations in the efficiency bandwidth both at the transition point and at full power, and also power bandwidth at full power, at least in its present realizations as disclosed in a paper by Piazzon et al., entitled "A method for Designing Broadband Doherty Power Amplifiers", Progress in Electromagnetics Research, Vol. 145, pp 319-331, 2014, or in a paper by R Giofré et al., entitled "A Distributed Matching/Combining Network Suitable to Design Doherty Power Amplifiers Covering More Than an Octave Bandwidth", Proc. IMS 2014 (Based on abstract).

SUMMARY

It is an aim of the present invention to provide a method and apparatus which obviate or reduce at least one or more of the disadvantages mentioned above.

According to a first aspect of the present invention there is provided an amplifier arrangement comprising N amplifier stages comprising a main amplifier stage and a plurality of peaking amplifier stages. The amplifier arrangement comprises a transmission line comprising a varying impedance for transforming a load impedance to a higher impedance at the main amplifier stage, wherein the plurality of peaking amplifiers are coupled at intermediate locations to the transmission line. The amplifier arrangement is configured such that at least two of the peaking amplifiers are collectively driven with time delayed versions of substantially the same signal.

According to another aspect of the present invention there is provided a method in an amplifier arrangement comprising N amplifier stages, comprising a main amplifier stage and a plurality of peaking amplifier stages, and a transmission line comprising a varying impedance for transforming a load impedance to a higher impedance at the main amplifier stage, and wherein the plurality of peaking amplifiers are coupled at intermediate locations to the transmission line. The method comprises collectively driving at least two of the peaking amplifiers with time delayed versions of substantially the same signal.

BRIEF DESCRIPTION OF THE DRAWINGS

For a better understanding of examples of the present invention, and to show more clearly how the examples may be carried into effect, reference will now be made, by way of example only, to the following drawings in which:

FIG. 1b shows the variation in transition point amplitude, FIG. 1c the efficiency at the transition point peaks and FIG. 1d the required relative phase angle variation for the embodiment of FIG. 1a;

FIG. 1e shows class B efficiency curves for the circuit of FIG. 1a;

FIG. 3b shows the variation in transition point amplitude, FIG. 3c the efficiency at the transition point peaks and FIG. 3d the required relative phase angle variation for the embodiment of FIG. 3a;

FIG. 4b shows the variation in transition point amplitude, FIG. 4c the efficiency at the transition point peaks and FIG. 4d the required relative phase angle variation for the embodiment of FIG. 4a;

FIG. 7b shows the variation in transition point amplitude, FIG. 7c the efficiency at the transition point peaks and FIG. 7d the required relative phase angle variation for the embodiment of FIG. 7a;

FIG. 9b shows the variation in transition point amplitude, FIG. 9c the efficiency at the transition point peaks and FIG. 9d the required relative phase angle variation for the embodiment of FIG. 9a;

FIG. 10b shows the variation in transition point amplitude, FIG. 10c the efficiency at the transition point peaks and FIG. 10d the required relative phase angle variation for the arrangement of FIG. 10a;

FIG. 11b shows the variation in transition point amplitude, FIG. 11c the efficiency at the transition point peaks and FIG. 11d the required relative phase angle variation for the embodiment of FIG. 11a;

FIG. 12b shows the variation in transition point amplitude, FIG. 12c the efficiency at the transition point peaks and FIG. 12d the required relative phase angle variation for the embodiment of FIG. 12a;

FIG. 13b shows the variation in transition point amplitude, FIG. 13c the efficiency at the transition point peaks and FIG. 13d the required relative phase angle variation for the embodiment of FIG. 13a.

DETAILED DESCRIPTION

Figure 1A:
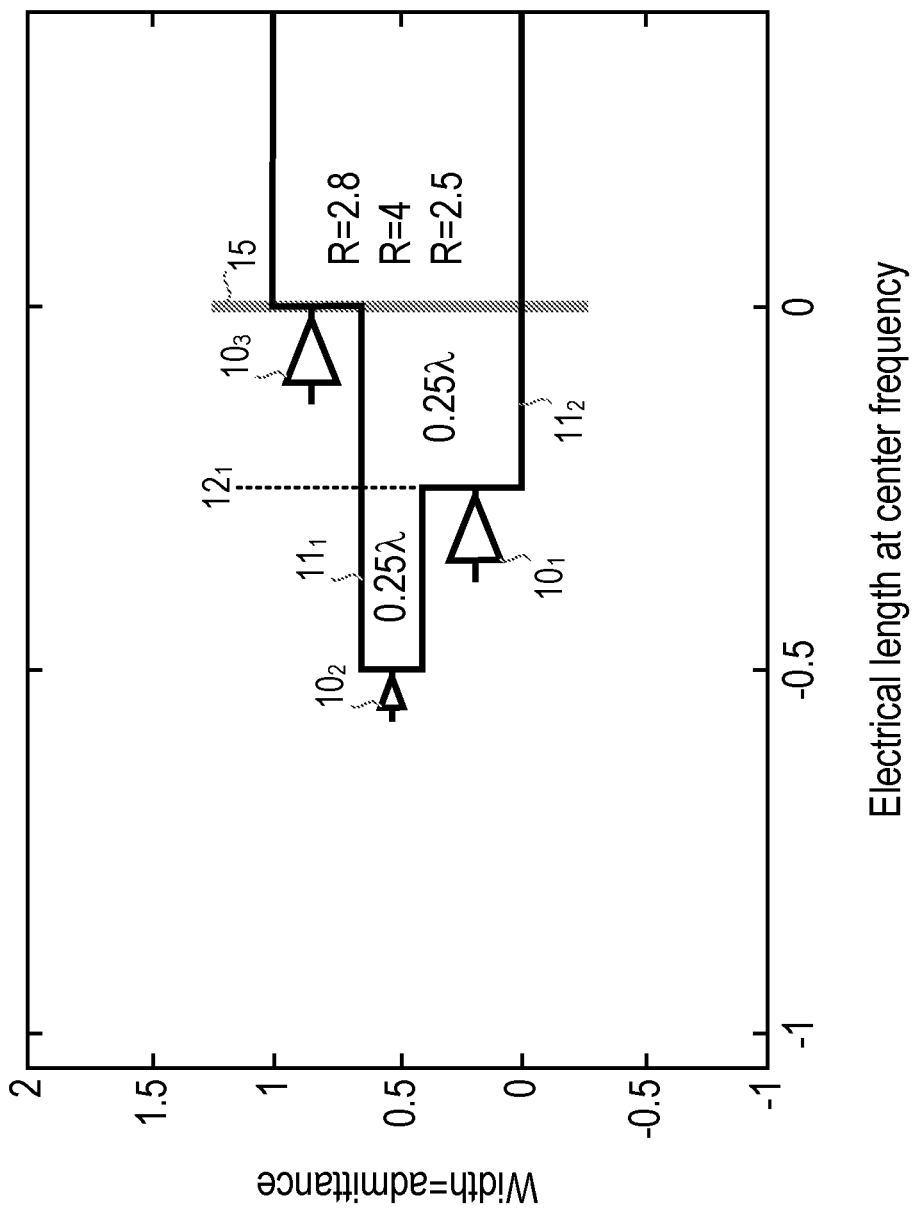
FIG. 1a shows an example of a three-stage amplifier circuit.

FIG. 1a shows an example of a three-stage amplifier circuit that is optimized for octave bandwidth, 67%, (2:1 high band edge to low band edge ratio equals 67% relative bandwidth) and 10 dB peak to average ratio (PAR) Rayleigh distributed amplitude signals.

The amplifier arrangement comprises three amplifier stages $10_1$ to $10_3$. The amplifier arrangement comprises a cascade of quarter wavelength transmission lines $11_1$ to $11_2$ coupled between an output of one of the three sub-amplifiers or amplifier stages ($10_2$ in this example, also referred to as the "main" amplifier) and an output node 15 of the amplifier arrangement.

One amplifier, for example the last amplifier stage, also known as the last peaking amplifier (i.e. the third amplifier stage $10_3$ of this example) is coupled to the output node 15. The output of the main amplifier (i.e. the second amplifier stage $10_2$ of this example) is coupled to the input of first section $11_1$ of the cascade of quarter wavelength transmission lines. The remaining peaking amplifier (i.e. the first amplifier stage $10_1$ of this example) is coupled to a respective junction $12_1$ in the cascade of quarter wavelength transmission lines $11_1$ to $11_2$.

In this example the optimal load resistances (for full power operation) for the sub-amplifiers are as follows: 4 times the common load for the main sub-amplifier $10_2$, and 2.5 and 2.8 times the common load for the two peaking amplifiers $10_1$ and $10_3$, respectively (the optimal load resistances illustrated by the values "R" in FIG. 1a). The maximum output power of the amplifiers, and the increases in admittance at each junction, are proportional to the inverse of these numbers. The width increases illustrate these admittance increases.

Figure 1B:
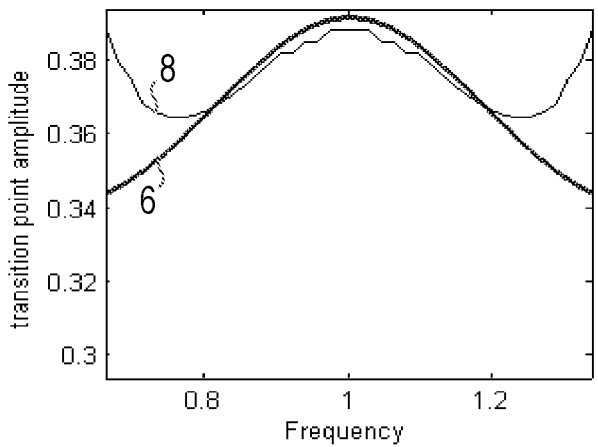

FIG. 1b shows the variation in transition point amplitude for the example of FIG. 1a, As can be seen, the transition point varies between 0.34 and 0.39 within the 2:1 bandwidth (the thick curve labeled 6 in FIG. 1b). The deviation of the thin curve labeled 8 from the thick curve labeled 6 shows that the high-efficiency low-amplitude range is terminated at a too low amplitude due to extra voltage at the main transistor output coming from series reactance.

Figure 1C:
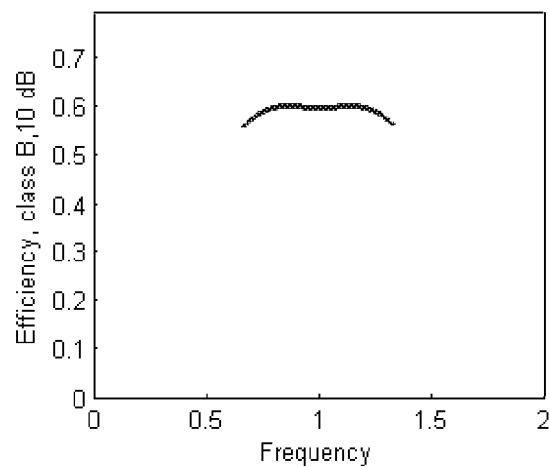

FIG. 1c shows the efficiency at the transition point peaks, and it can be seen that the average efficiency with correct drive is close to optimal in the middle but drops a few percentage points towards the edges.

Figure 1D:
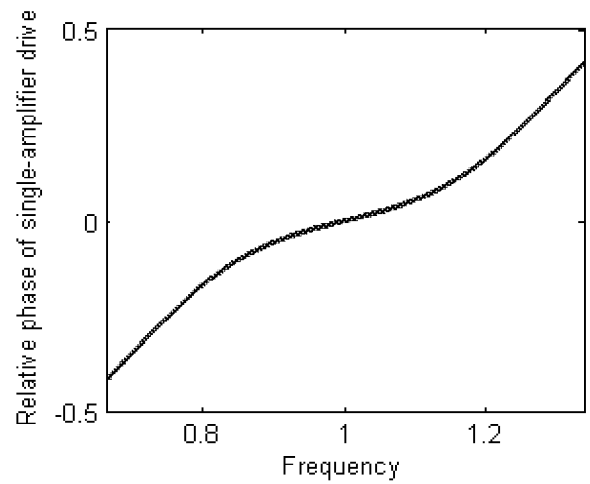

FIG. 1d shows the required relative phase angle variation for the embodiment of FIG. 1a. As can be seen, in this example the required relative phase angle at the transition point varies between −0.4 and 0.4 radians.

Figure 1E:
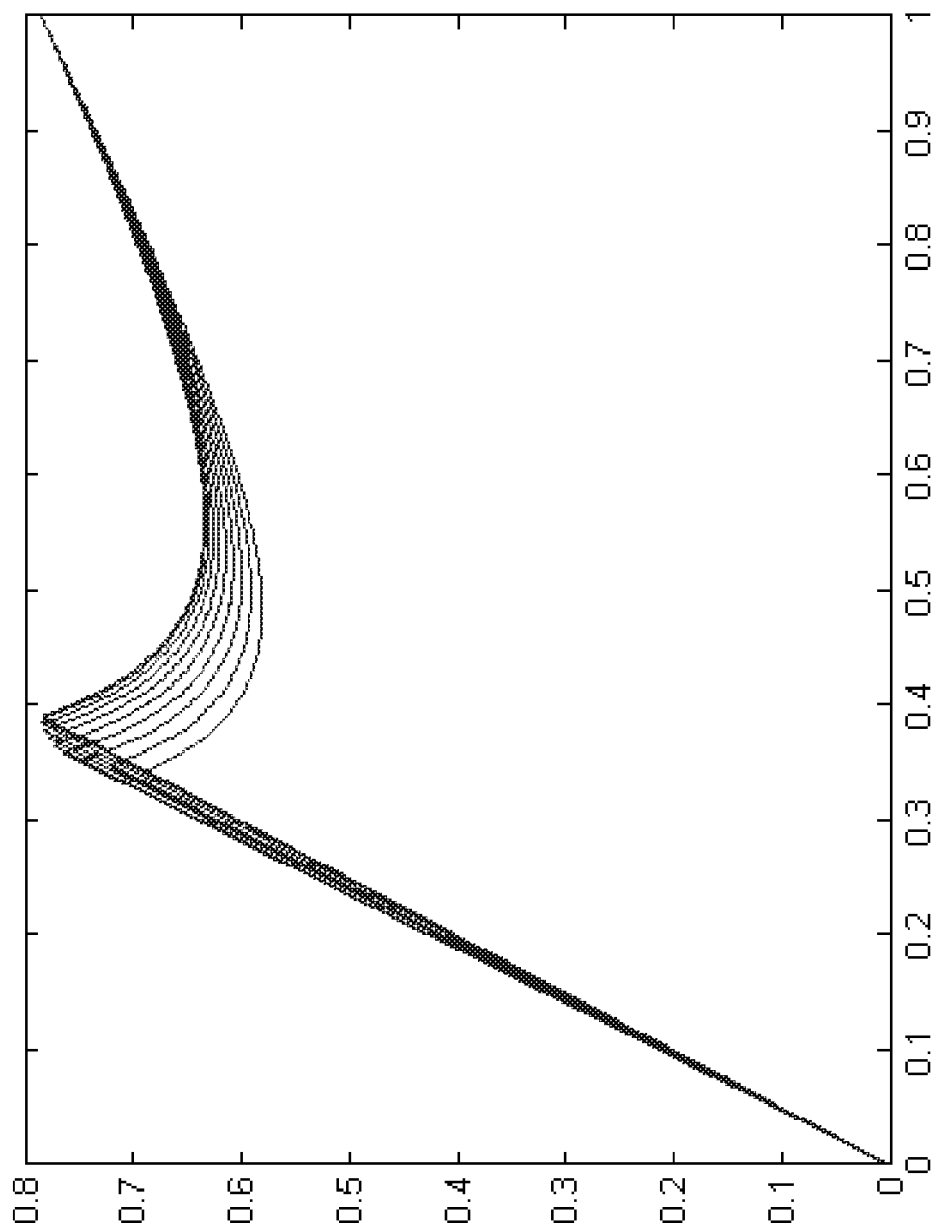

FIG. 1e shows class B efficiency curves for the amplifier circuit in the example of FIG. 1a within the bandwidth, where it can be seen how the single-amplifier region is terminated at a too low amplitude (and peak efficiency at the transition point) at frequencies outside the inner 40% relative bandwidth.

The embodiments of the invention as will be described below, provide a method to construct very wideband amplifiers, for example Doherty amplifiers. The amplifier arrangements according to the embodiments of the invention have high efficiency and consistent properties over large bandwidths (in the absence of parasitic capacitances and other practical circuit considerations). As will be described, parasitic capacitance and inductance can be handled with methods for compensating for such parasitic capacitances and inductances (for high-bandwidth amplifiers).

The embodiments described below have the effect of providing an amplifier arrangement, such as an Doherty amplifier arrangement, with "more stages than necessary". This is made possible by using at least two of the peaking amplifiers collectively for in-phase combining, for example by collectively driving two or more of the peaking amplifiers, to yield maximum output power. This has the advantage of providing freedom in the number and sizes of the peaking amplifiers, and hence in the number and impedances of the reactive output network, such as the quarter wavelength transmission lines in a multistage Doherty amplifier.

The impedances of the quarter wavelength transmission lines can then be arranged to optimize the bandwidth of low ripple in the transimpedance from the first (main) amplifier to the load. The peaking sub-amplifiers can be configured to have optimal load resistances (for full output) that are matched to the admittance difference between the quarter wavelength transmission lines.

Low ripple in this transimpedance makes for an almost constant transition point amplitude over the design bandwidth, which has the advantage that very simple static gain and bias settings can be used. For a certain transition point and number of peaking amplifiers, a tradeoff between transition point ripple and bandwidth can be made. This tradeoff may be improved upon by increasing the number of peaking amplifiers, and hence the number of quarter wavelength transmission lines.

The embodiments of the invention consists of modified multistage amplifiers, such as Doherty amplifiers, in which most degrees of freedom are used for obtaining consistent properties and high efficiency over large bandwidths. Two or more of the peaking amplifiers are driven by time-delayed versions of substantially the same signal, for example with the same amplitude function (for example obtained by class C biasing in the peaking amplifiers themselves or in one or more driver stages), so at least some of the higher transition points are not used. This means that the actual transition point amplitudes (except the lowest one in a case where all peaking amplifiers are driven by time-delayed versions of the same signal) become insignificant, and the degrees of freedom that the higher number of stages give can therefore be used to increase bandwidth.

In-phase combination to the sum of maximum output powers of any number of sub-amplifiers is possible over any bandwidth. This may be achieved by ensuring that the admittance sums in any junction of transmission lines is the same going in as going out (towards the output), and that all incoming waves (from successively more sub-amplifiers) are in phase at the junctions.

To achieve full output power while optimally loading each amplifier, the examples of the embodiments described below are configured such that the peaking sub-amplifiers have optimal load resistances (for full output) that are matched to the admittance difference between the transmission line sections in the multistage Doherty's quarter wavelength cascade. The timing of the drive signals to the peaking amplifiers may be offset by the same time as the travel time for the wave across all prior transmission line sections. An example of an input side network for managing this aspect is presented in co-pending patent number WO2016/056951 by the present Applicant.

Since the embodiments of the invention provide a known output power over any bandwidth, and do not care about one or more of the higher transition points, the embodiments of the invention can use all degrees of freedom to increase bandwidth for the main sub-amplifier.

For example, one way to increase bandwidth is to arrange the transmission lines, for example the quarter wavelength sections of a cascade, to form a multi-section stepped impedance transformer. To make the drive signal processing as simple as possible while having high and consistent efficiency, the quarter wavelength transmission lines may be arranged to obtain low ripple in the transimpedance from the first (main) amplifier $10_2$ to the load across the bandwidth, together with low reactance in the self-impedance at the main amplifier. Low ripple and low reactance makes for an almost constant transition point amplitude with high efficiency over the design bandwidth, which has the advantage that comparatively simple static gain and bias settings can be used.

The transimpedance ripple and low reactance requirement may also be translated into a reflection coefficient requirement (impedance matching), which can then be met with multi-section stepped transformers obtained from standardized tables, for example with Chebyshev or Butterworth responses.

The target for impedance matching, for example, is the transimpedance quotient squared, i.e. if the transimpedance target is 3 times the load resistance (for a transition point of 0.33 of maximum amplitude), the load-to-self impedance transformation target is 9 times.

It is noted that the embodiments of the invention may be implemented with different numbers of amplifier stages. As mentioned above, according to the embodiments of the invention an increase in the number of stages generally yields better performance in terms of bandwidth and/or ripple within the bandwidth.

Figure 2A:
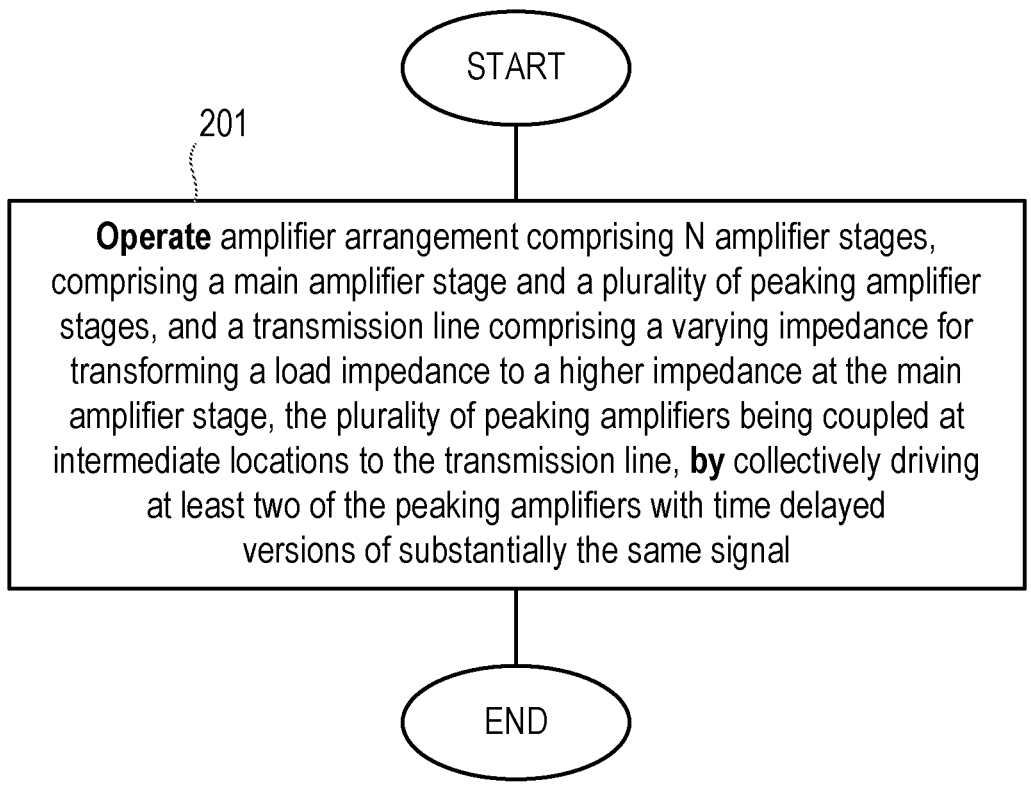
FIG. 2a shows a method according to an embodiment of the present invention.

FIG. 2a shows a method according to an embodiment of the present invention, in an amplifier arrangement comprising N amplifier stages $10_1$ to $10_N$, comprising a main amplifier stage and a plurality of peaking amplifier stages, and a transmission line comprising a varying impedance for transforming a load impedance to a higher impedance at the main amplifier stage, wherein the plurality of peaking amplifiers are coupled at intermediate locations to the transmission line. The method comprises the step of operating the amplifier arrangement such that at least two of the peaking amplifiers are collectively driven with time delayed versions of substantially the same signal, step 201.

According to one example the amplifier arrangement is driven such that the amplifier arrangement comprises N−2 or fewer transition points.

Since there are N−2 or fewer transition points, the amplifier arrangement effectively has more amplifier stages than are nominally required in a Doherty amplifier arrangement. In other words, the number of peaking amplifiers is increased compared to the number of peaking amplifiers in a Doherty amplifier configured to have the same number of transition points.

In one embodiment the transmission line comprises a cascade of transmission lines coupled between the N amplifier stages and an output node of the amplifier arrangement, and wherein the method comprises operating the amplifier arrangement in a Doherty mode of operation.

The plurality of peaking amplifiers may be distributed by varying electrical lengths along the cascade of transmission lines.

According to one embodiment, the size of each amplifier stage may be selected to have an optimal load resistance matched to an admittance step in a corresponding junction between transmission line segments.

A transmission line connecting each amplifier to a junction between transmission line segments may have a characteristic impedance matched to the admittance step in a corresponding junction between transmission line segments, as will be described in further detail below.

Figure 2B:
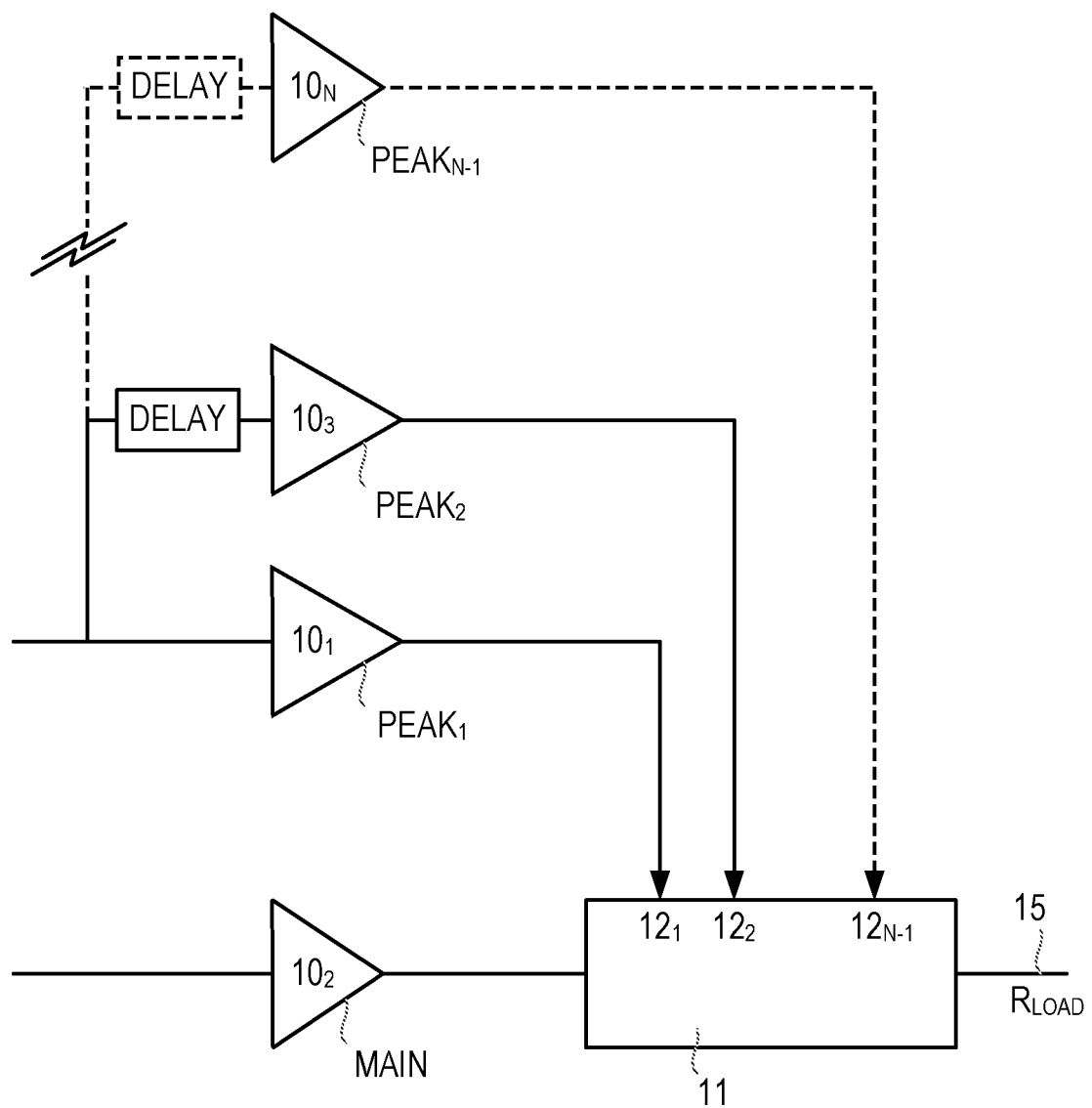
FIG. 2b shows an example of an amplifier arrangement according to an embodiment of the present invention.

FIG. 2b shows an example of an amplifier arrangement according to another embodiment of the invention. The amplifier arrangement comprises N amplifier stages $10_1$ to $10_N$ comprising a main amplifier stage $10_2$ and a plurality of peaking amplifier stages $10_1$ and $10_3$ to $10_N$. The amplifier arrangement comprises a transmission line 11 comprising a varying impedance for transforming a load impedance $R_{LOAD}$ to a higher impedance at the main amplifier stage $10_2$. The plurality of peaking amplifiers are coupled at intermediate locations $12_1$ to $12_{N-1}$ to the transmission line 11. The amplifier arrangement is configured such that at least two of the peaking amplifiers are collectively driven with time delayed versions of substantially the same signal.

The amplifier arrangement may be configured to comprise N−2 or fewer transition points.

In one embodiment the transmission line 11 comprises a cascade of transmission lines coupled between the N amplifier stages and an output node 15 of the amplifier arrangement, and wherein the amplifier arrangement is configured to operate in a Doherty mode of operation.

The plurality of peaking amplifiers may be distributed by varying electrical lengths along the cascade of transmission lines.

In an embodiment the number of peaking amplifiers is increased compared to the number of peaking amplifiers in a Doherty amplifier configured to have the same number of transition points.

As will be seen for the description of the detailed embodiments below, the size of each amplifier stage may be selected to have an optimal load resistance matched to an admittance step in a corresponding junction between transmission line segments.

A transmission line connecting each amplifier to a junction between transmission line segments may have a characteristic impedance matched to the admittance step in a corresponding junction between transmission line segments.

The impedances of the cascade of transmission lines may be configured such that the impedances optimize the bandwidth of low ripple in a transimpedance from the main amplifier to a load.

According to some embodiments, the transmission line 11 comprises a cascade of quarter wavelength transmission lines coupled between an output of the main amplifier $10_2$ of the N amplifier stages $10_1$ to $10_N$ and an output node 15 of the amplifier arrangement, wherein the cascade comprises N−1 quarter wavelength transmission lines $11_1$ to $11_{N-1}$. In such embodiments an output of a first peaking amplifier $10_N$ of the N amplifier stages is coupled to the output node 15, and remaining peaking amplifiers $10_1$, $10_3$ to $10_{N-1}$ of the N amplifier stages coupled to respective junctions in the cascade of quarter wavelength transmission lines $11_1$ to $11_{N-1}$.

Figure 3A:
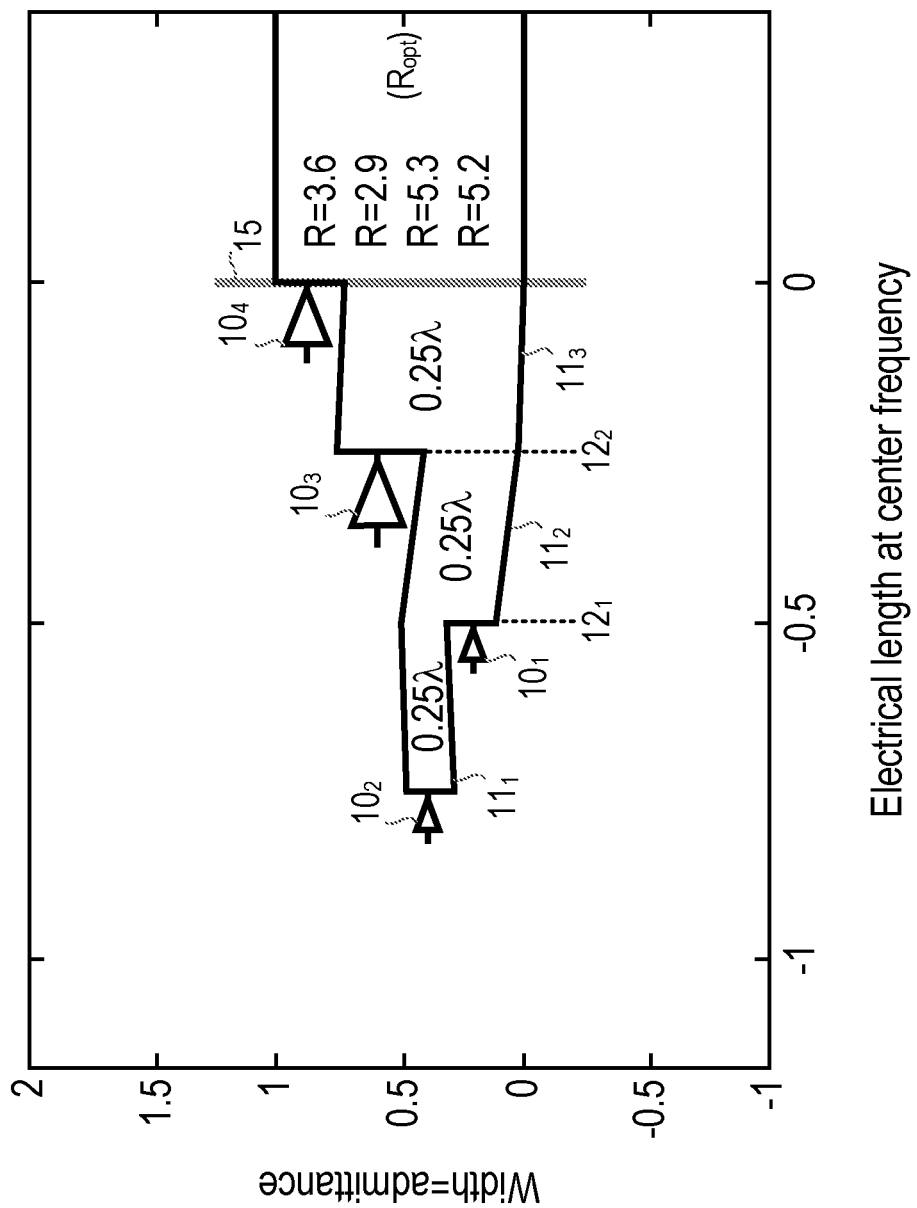
FIG. 3a shows an example of an amplifier arrangement according to another embodiment.

FIG. 3a shows another example of an amplifier arrangement according to an embodiment. In particular, FIG. 3a shows how increasing the number of amplifier stages can improve the performance. FIG. 3a is an example of a four-stage amplifier arrangement that has been optimized for the same criteria as the example of FIG. 1a, i.e. octave bandwidth and 10 dB Rayleigh PAR, but comprising more amplifier stages (i.e. one additional amplifier stage in this example).

The amplifier arrangement comprises four amplifier stages $10_1$ to $10_4$. The amplifier arrangement comprises a transmission line comprising a varying impedance for transforming a load impedance to a higher impedance at the main amplifier stage (i.e. reactive output network), for example a cascade of quarter wavelength transmission lines $11_1$ to $11_3$ coupled between an output of one of the four sub-amplifiers or amplifier stages ($10_2$ in this example, also referred to as the "main" amplifier) and an output node 15 of the amplifier arrangement. The plurality of peaking amplifiers are coupled at intermediate locations to the transmission line 11.

One amplifier, for example the last amplifier stage, also known as the last peaking amplifier (i.e. the fourth amplifier stage $10_4$ of this example) is coupled to the output node 15. The output of the main amplifier (i.e. the second amplifier stage $10_2$ of this example) is coupled to the input of first section $11_1$ of the cascade of quarter wavelength transmission lines. The remaining peaking amplifiers, for example the first and third peaking amplifiers (i.e. the first amplifier stage $10_1$ and the third amplifier stage $10_3$ of this example) are coupled to respective intermediate locations (or junctions) $12_1$ and $12_2$ in the cascade of quarter wavelength transmission lines $11_1$ to $11_3$.

In use, the amplifier arrangement of FIG. 3a is configured to operate with N−2 or fewer transition points in the Doherty mode of operation (rather than N−1 transition points that would normally be used in a Doherty amplifier). This is because at least two or more of the peaking amplifiers are driven with time delayed versions of substantially the same signal. This means that the amplifier arrangement of FIG. 3a comprises more amplifier stages than are actually needed. In other words, the number of peaking amplifiers is increased compared to a nominal value of peaking amplifiers required to provide N−1 transition points in a Doherty mode of operation.

Thus, FIG. 3a shows an example of an amplifier arrangement comprising N amplifier stages $10_1$ to $10_N$, comprising a main amplifier stage and a plurality of peaking amplifier stages. A cascade of transmission lines are coupled between the N amplifier stages and an output node of the amplifier arrangement such that the amplifier arrangement is configured to operate in a Doherty mode of operation. The amplifier arrangement is configured to operate with N−2 or fewer transition points in the Doherty mode of operation.

As mentioned above, the amplifier arrangement of FIG. 3a is configured such that at least two of the plurality of peaking amplifiers (i.e. two or more of the peaking amplifiers $10_1$, $10_3$ or $10_4$ in this example) are collectively driven by time delayed versions of substantially the same signal during operation.

The load resistance of each amplifier stage can be configured to be an optimal value for a given output load, Ropt. For example, the size of each amplifier and the admittance of its corresponding section of the cascade of quarter wavelength transmission lines can each be configured to be inversely proportional to the optimal value of the load resistance. The size of each amplifier stage is selected to have an optimal load resistance matched to an admittance step in a corresponding junction between transmission line segments.

According to the example of the embodiment of FIG. 3a, the optimal load resistance (for full output power) for the main sub-amplifier $10_2$ is shown as being 5.3 times the common load. The peaking amplifiers $10_1$, $10_3$ and $10_4$ have optimal load resistances of 5.2, 2.9 and 3.6 times the common load, respectively (illustrated by the values "R").

It is noted that a design process for an amplifier arrangement according to an embodiment of the present invention may first comprise the step of determining the impedance (admittance) steps in the reactive output network, for example the wideband multistage quarter wavelength transformer (i.e. cascade). The impedance (admittance) steps may be related to the set of bandwidth, ripple requirements and the number of steps (peaking amplifiers). The admittance steps (difference between the admittances of the transmission lines before/after a junction) determines the smallest-size of amplifier, i.e. highest-Ropt, that can be used. Hence, 1/Ropt of the smallest feasible transistor is "matched" to the admittance step. It is noted that larger transistors, i.e. with higher output current and hence lower Ropt, can be used, but will be underutilized. It is noted that sometimes underutilization may be used because it can provide other benefits. The general impedance level is determined by the voltage swing on the transistors and the total output power.

An embodiment of the invention may therefore determine the admittance of each stage of a cascade based on one or more application criteria, and then select an amplifier size for each corresponding stage.

Thus, the size of each amplifier stage may be selected to have an optimal load resistance matched to an admittance step in a corresponding junction between transmission line segments. Also, a transmission line connecting each amplifier to a junction between transmission line segments may have a characteristic impedance matched to the admittance step in a corresponding junction between transmission line segments.

Figure 3B:
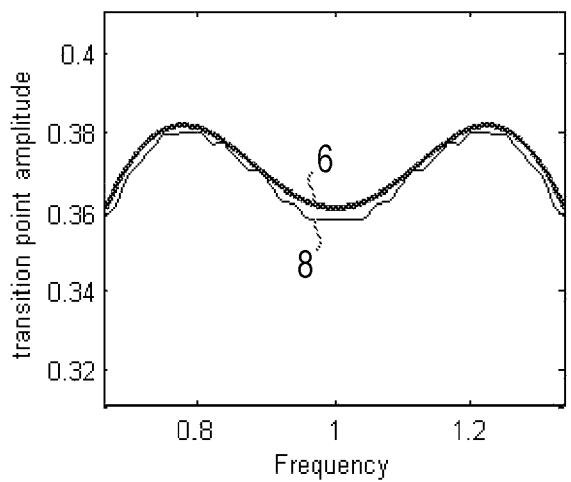

Referring to FIG. 3b, it can be seen that the variation in transition point amplitude has been decreased to less than half of that of the three-stage example of FIG. 1a above, staying between 0.36 and 0.38 over the bandwidth. The deviation of the thin curve labelled 8 from the thick curve labelled 6 has been decreased further, meaning that the efficiency at the transition point peaks close to the maximum possible over the whole bandwidth.

Figure 3C:
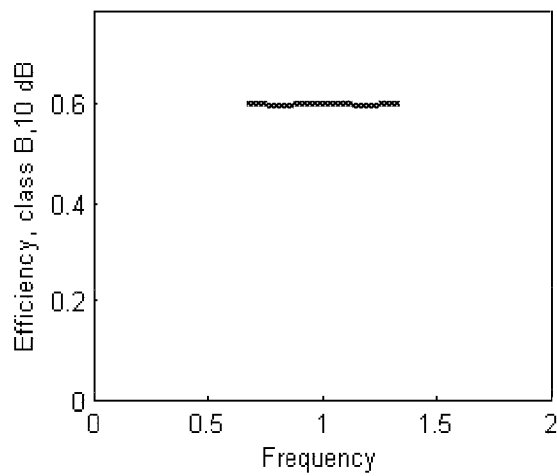
Figure 3D:
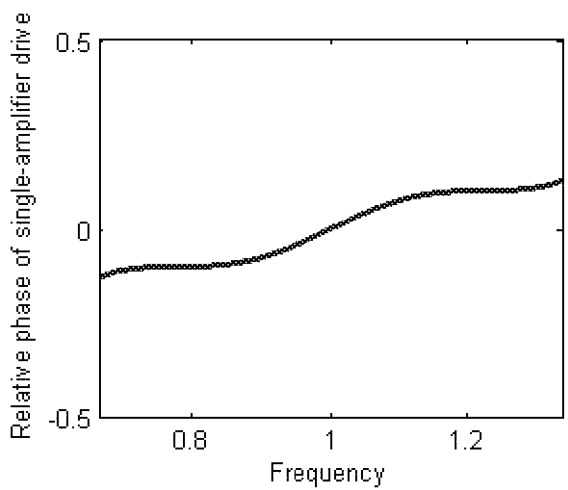

As shown by FIG. 3d, the required relative phase angle at the transition point has been decreased to between about −0.12 and 0.12 radians, which means that a constant relative drive phase of the main amplifier will not affect efficiency much. The resulting average efficiency, as shown in FIG. 3c, is close to optimal over the whole bandwidth.

Some applications may only have access to a small number of transistor sizes. Other applications have to realise larger amplifiers by paralleling a plurality of smaller amplifiers. The embodiments of the present invention may provide good performance in such situations if the transistor sizes in the optimal solution are sufficiently close to the available set.

Figure 4A:
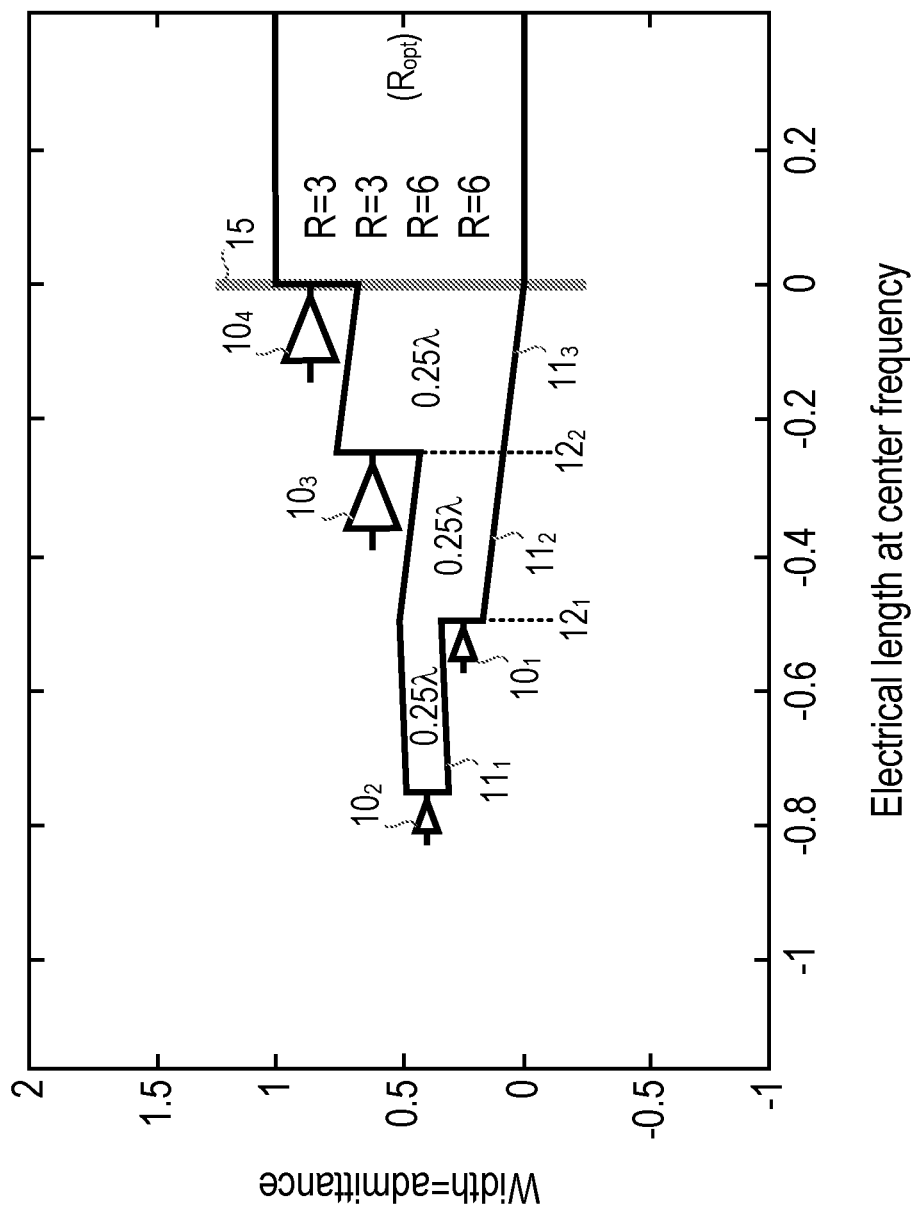
FIG. 4a shows an example of an amplifier arrangement according to another embodiment.

FIG. 4a shows an example of an amplifier arrangement according to another embodiment, and in particular of an application where only two transistor sizes are available in a 1-to-2 relation, instead of the optimal ones in the example of FIG. 3a above.

As with FIG. 3a, the amplifier arrangement of FIG. 4a comprises four amplifier stages $10_1$ to $10_4$. The amplifier arrangement comprises a cascade of quarter wavelength transmission lines $11_1$ to $11_3$ coupled between an output of one of the four sub-amplifiers or amplifier stages ($10_2$ in this example, also referred to as the "main" amplifier) and an output node 15 of the amplifier arrangement.

One amplifier, for example the last amplifier stage, also known as the last peaking amplifier (i.e. the fourth amplifier stage $10_4$ of this example) is coupled to the output node 15. The output of the main amplifier (i.e. the second amplifier stage $10_2$ of this example) is coupled to the input of first section $11_1$ of the cascade of quarter wavelength transmission lines. The remaining peaking amplifiers, for example the first and third peaking amplifiers (i.e. the first amplifier stage $10_1$ and the third amplifier stage $10_3$ of this example) are coupled to respective junctions $12_1$ and $12_2$ in the cascade of quarter wavelength transmission lines $11_1$ to $11_3$.

As mentioned above, in this example it is assumed that only two transistor sizes are available, and in the example the main amplifier $10_2$ and the first peaking amplifier $10_1$ are shown as being half the size of the second and third peaking amplifiers $10_3$ and $10_4$.

The main sub-amplifier $10_2$ has in this case an optimal load resistance for the main sub-amplifier of 6 times the common load resistance, while the peaking amplifiers $10_1$, $10_3$ and $10_4$ have optimal load resistances of 6, 3 and 3 times the common load, respectively.

Figure 4B:
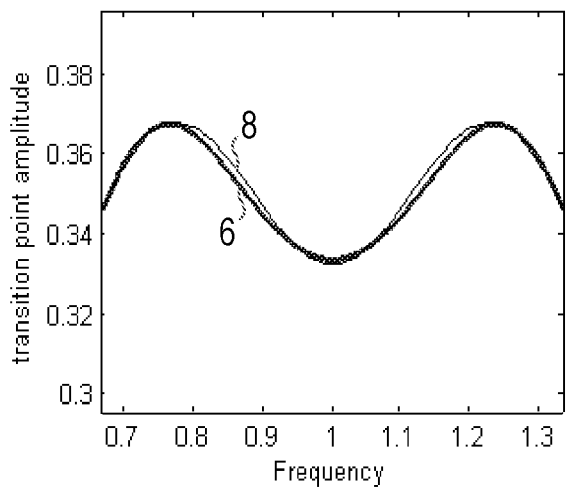
Figure 4C:
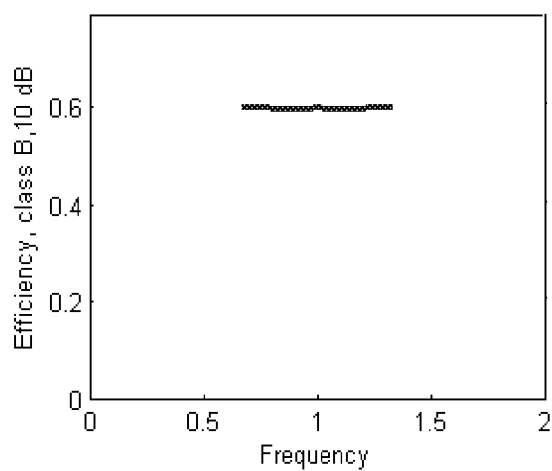
Figure 4D:
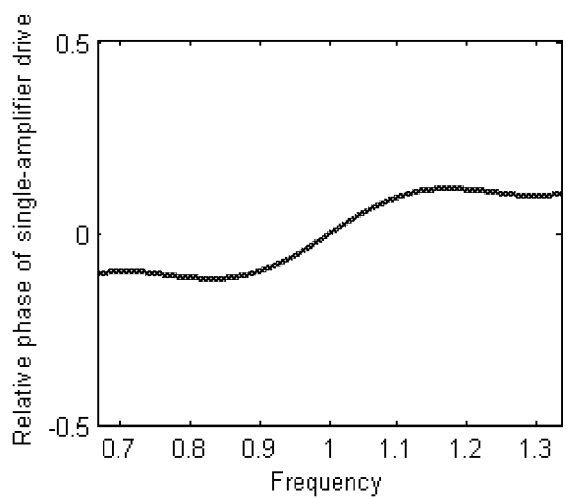
Figure 5:
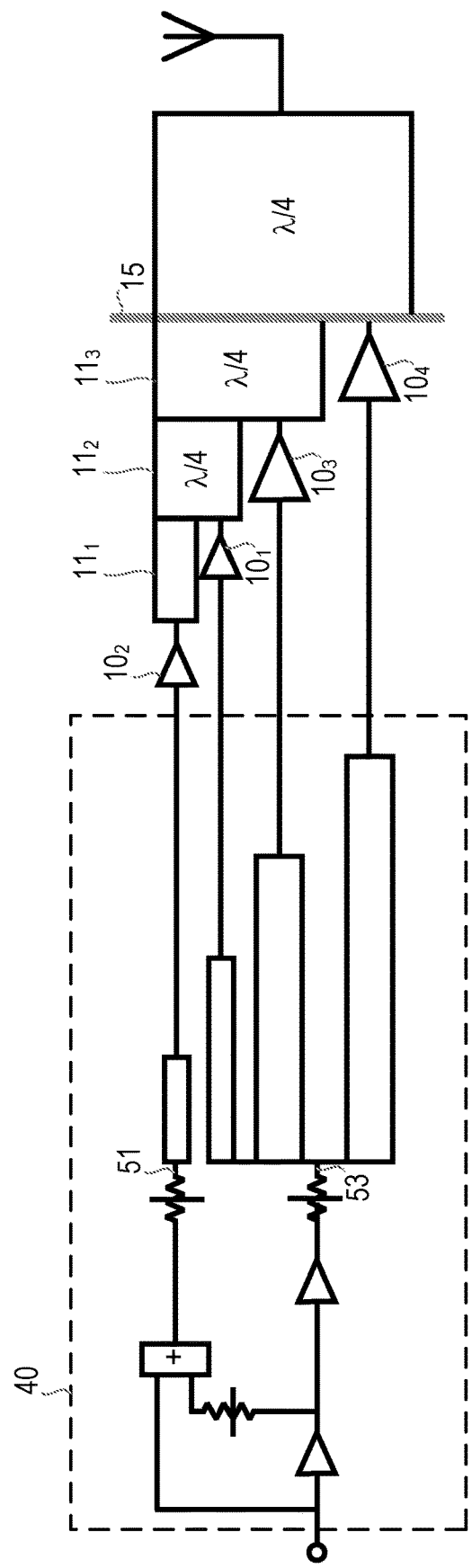
FIG. 5 shows an example of an implementation, including an example of an input drive circuit.

From FIGS. 4b, 4c and 4d it can be seen that the efficiency is only marginally affected, although the transition point has been shifted down slightly. The variations in transition point and relative phase angle are also almost the same as for the optimal example of FIG. 3a. po FIG. 5 shows an example of an implementation of the embodiment of FIG. 4a, including an example of an input drive circuit 40. The input drive circuit 40 is configured to control the main amplifier $10_2$ using a first drive signal 51, and collectively control at least two of the remaining peaking amplifiers (for example collectively control all of the remaining peaking amplifiers $10_1$, $10_3$ and $10_4$ in this example) using a second drive signal 53. Thus, in this example each of the peaking amplifiers receives time delayed versions of substantially the same signal 53. Further details of the input drive circuitry 40 can be found in co-pending patent number WO2016/056951 by the present Applicant. Although the example of FIG. 5 shows all of the peaking amplifiers being driven collectively controlled, it is noted that two or more peaking amplifiers may be controlled in order to reduce the number of transition points.

In the example of FIG. 5 the small variations in relative phase angle may be ignored so that all signal components at the input of the main sub-amplifier $10_2$ can have the same phase. The class C signal part may then only need to be applied once, and with less amplitude than in the more general system, as described further in co-pending patent number WO2016/056951.

Since the variations in transition point amplitude are small, it is ssible to have the same transition point across the whole bandwidth.

Figure 6:
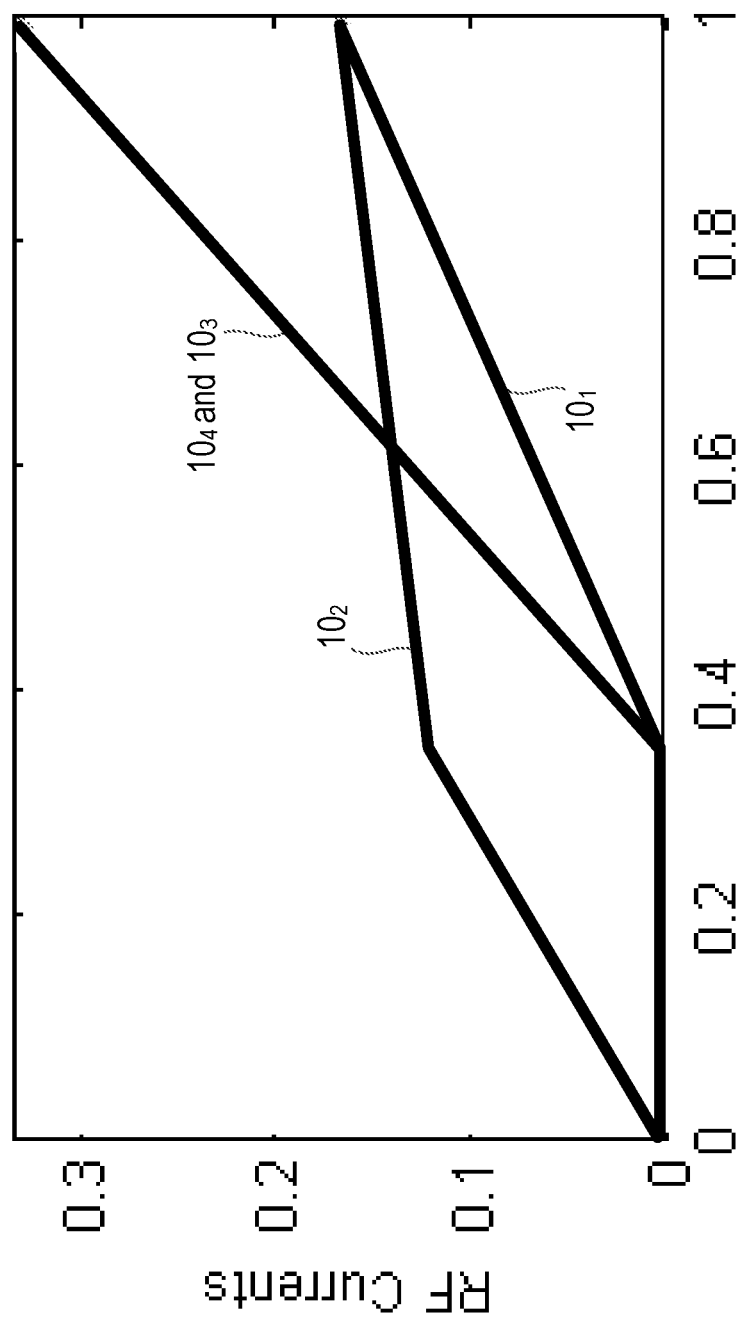
FIG. 6 shows an example of RF output current amplitudes.

FIG. 6 shows an example of the ideal RF output current amplitudes of the sub-amplifiers. It can be seen how the drive signal of the main amplifier $10_2$ is suppressed above the transition point by applying the class C signal with opposite phase to the linear signal part.

Figure 7A:
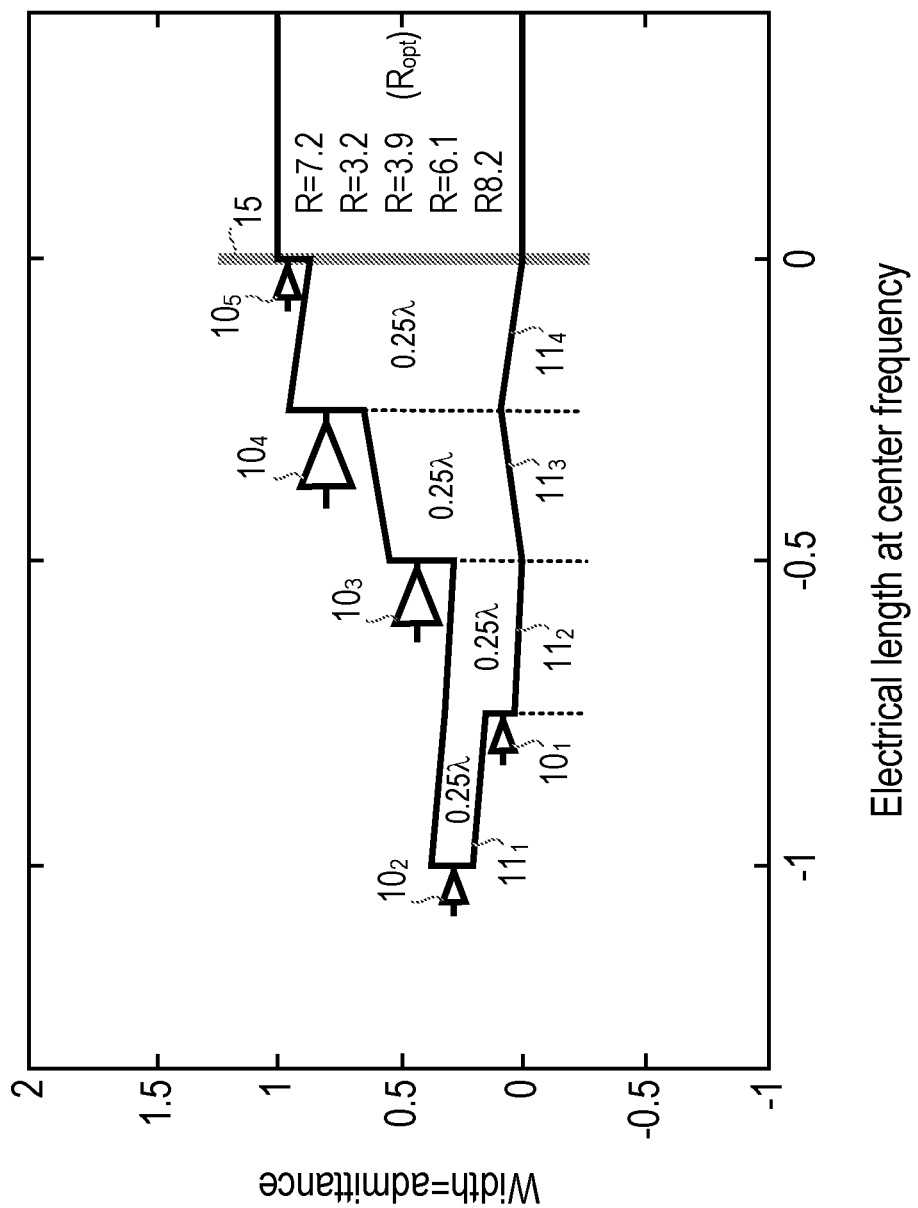
FIG. 7a shows an example of an amplifier arrangement according to another embodiment.

FIG. 7a shows an example of an amplifier arrangement according to another embodiment. In this example, to further show the steady increase in performance as the number of stages increase, it comprises a five-stage amplifier that has been optimized for the same criteria as the previous examples.

The optimal load resistance for the main sub-amplifier $10_2$ is in this case 6.1 times the common load. The peaking amplifiers $10_1$, $10_3$, $10_4$ and $10_5$ have optimal load resistances of 8.2, 3.9, 3.2 and 7.2 times the common load, respectively.

Figure 7B:
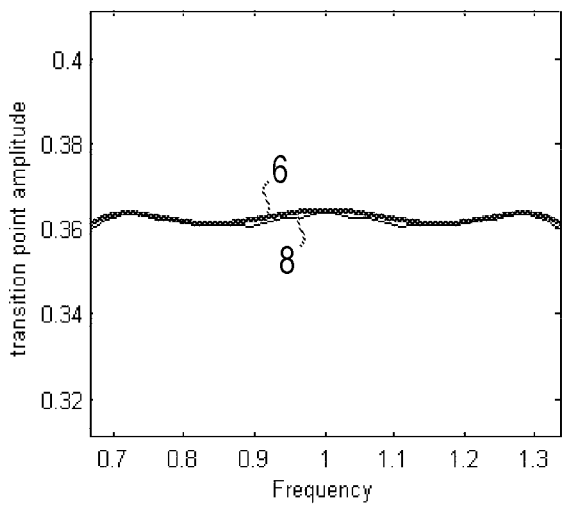

FIG. 7b shows the variation in transition point amplitude, where it can be seen that this has been decreased to about a fourth of that of the previous four-stage example of FIG. 4a above, staying between 0.36 and 0.365 over the bandwidth, with efficiency at the transition point peaks close to the maximum possible over the whole bandwidth.

Figure 7C:
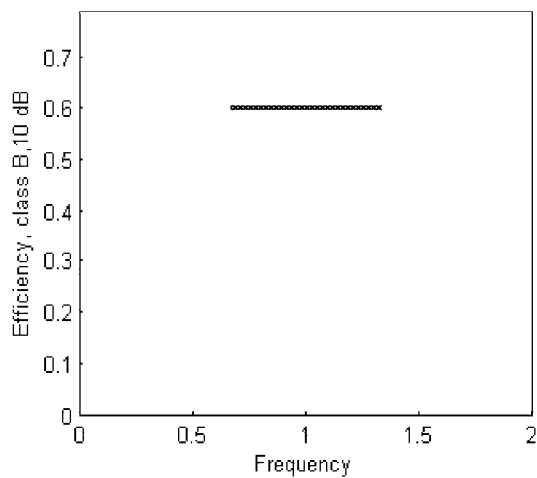
Figure 7D:
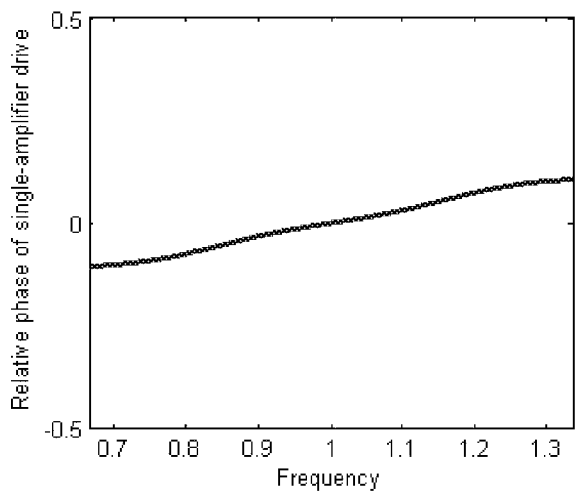

FIG. 7d shows the required relative phase angle variation for the embodiment of FIG. 7a, where it can be seen that the required relative phase angle at the transition point has been somewhat decreased, to between about −0.1 and 0.1 radians. The resulting average efficiency, as shown in FIG. 7c, is very close to optimal over the whole bandwidth.

Figure 8A:
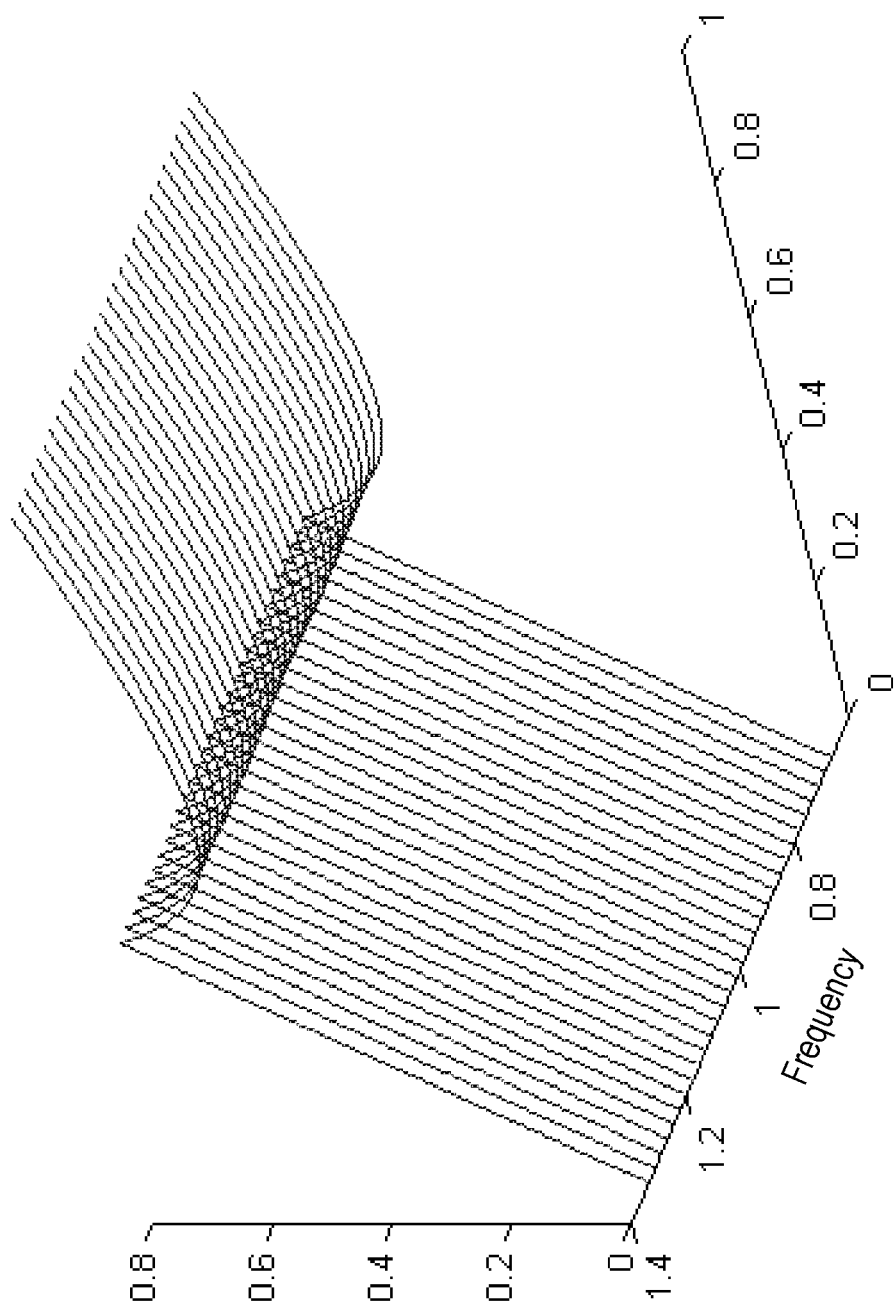
FIG. 8a show the efficiency curves over the bandwidth, also illustrating the frequency.
Figure 8B:
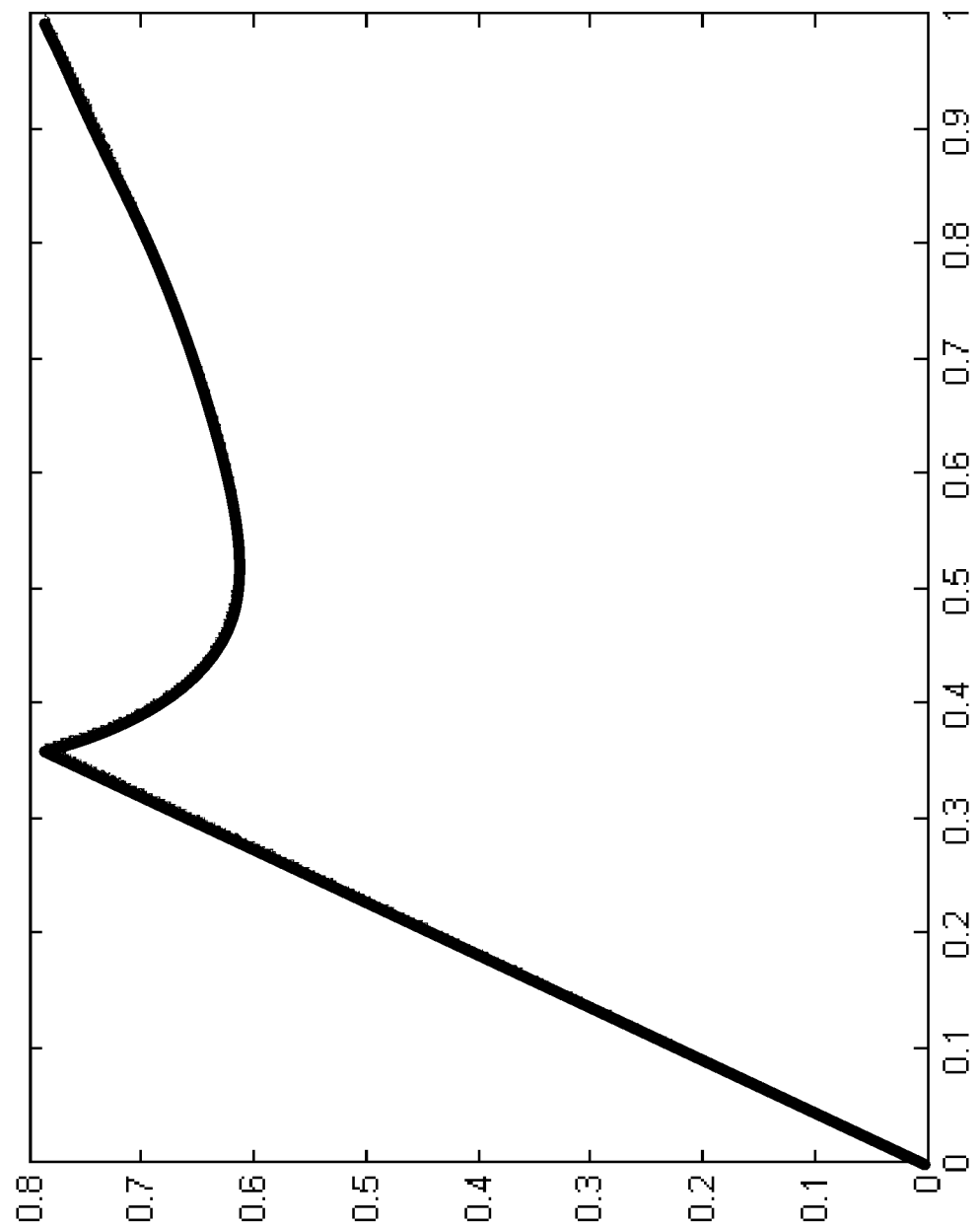
FIG. 8b shows another illustration of the efficiency curves over the bandwidth (without illustrating the frequency)

The efficiency curves over the bandwidth are now very similar, as shown in FIG. 8a (which also illustrates the frequency), and FIG. 8b (without illustrating the frequency).

Parasitic reactances at the output of the transistors can be handled in many ways. For example, pure capacitance at the transistor output node can be absorbed into the cascade of transmission lines, making "synthetic" transmission lines of this capacitance and a shorter transmission line of somewhat higher impedance. Lead inductance can be cancelled, for example, by using a negative transformer as part of the series inductance in a transmission line. A combination of the two reactance types may sometimes look like short transmission lines. These can substantially be absorbed in the same manner as a capacitance, for example by shortening the quarter wavelength transmission lines.

Thus, according to one embodiment at least one of the quarter wavelength transmission lines of the cascade is adapted to compensate for parasitic capacitance. In one example a quarter wavelength transmission line closer to the input side of the cascade is shortened by a greater amount compared to a quarter wavelength transmission line closer to the output side of the cascade.

Figure 9A:
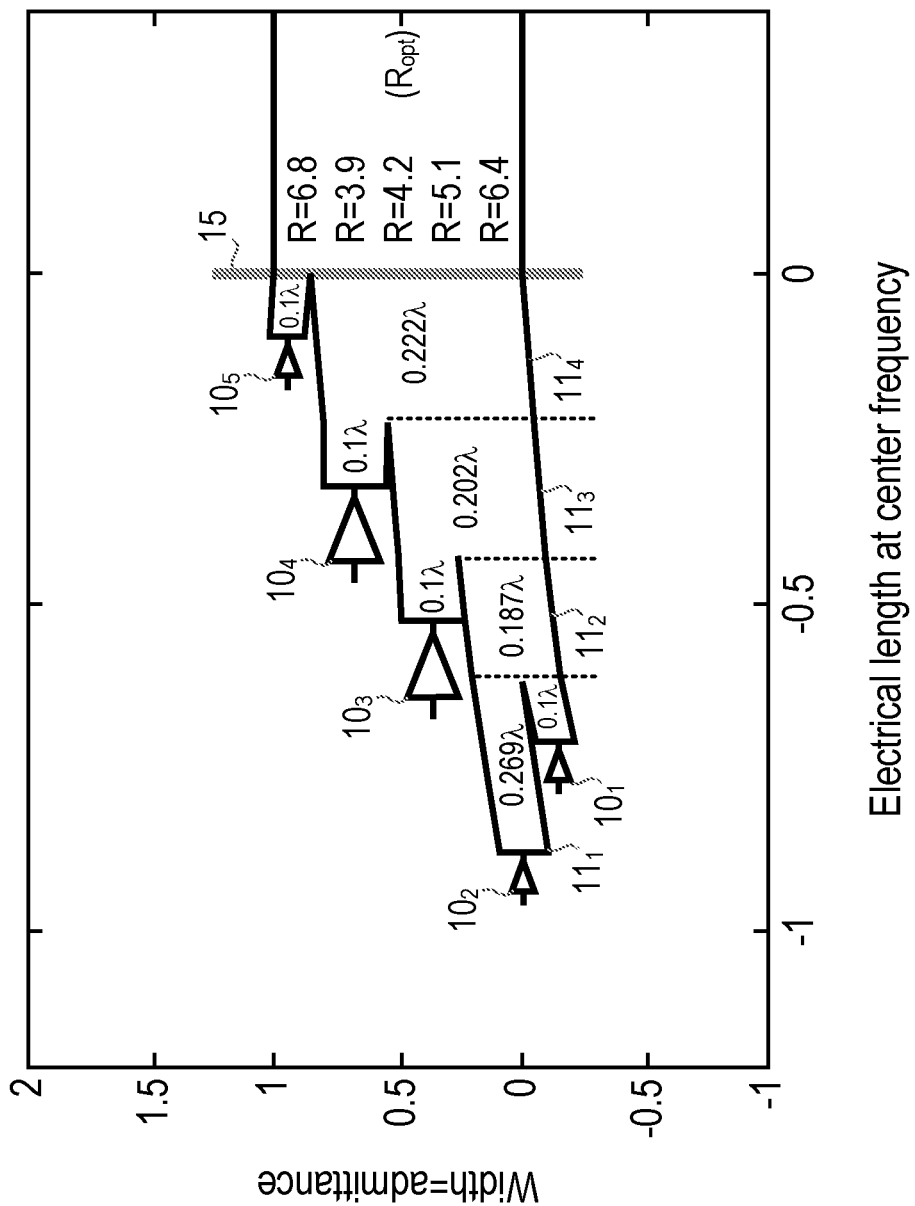
FIG. 9a shows an example of an amplifier arrangement according to another embodiment.

FIG. 9a shows an example of an amplifier arrangement according to another embodiment, and in particular an example in which parasitic capacitances are represented by 0.1 lambda transmission lines from each sub-amplifier, and compensation provided by shortening of the quarter wavelength transmission lines alone.

It the example of FIG. 9a it can be seen that the quarter wavelength lines can be shortened more at the beginning of the cascade of quarter wavelength transmission lines (for example near the main sub-amplifier $10_2$), since the impedances of the quarter wavelength transmission lines are higher there. In the embodiment of FIG. 9a it s noted that the "center frequency" has moved down marginally from an uncompensated state (whereby all quarterwave lines are optimized). It is also noted that 0.1λ transmission lines are shown between each peaking amplifier ($10_1$, $10_3$ and $10_4$) and its corresponding intersection of the cascade, and between peaking amplifier $10_4$ and the output 15. These 0.1λ transmission lines represent typical parasitic as mentioned above. As can be seen from the graphs below, such parasitics do not adversely affect the operation of embodiments of the present invention.

Figure 9B:
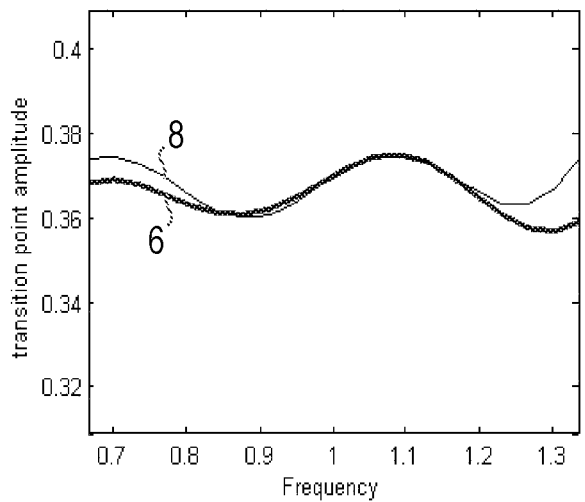
Figure 9C:
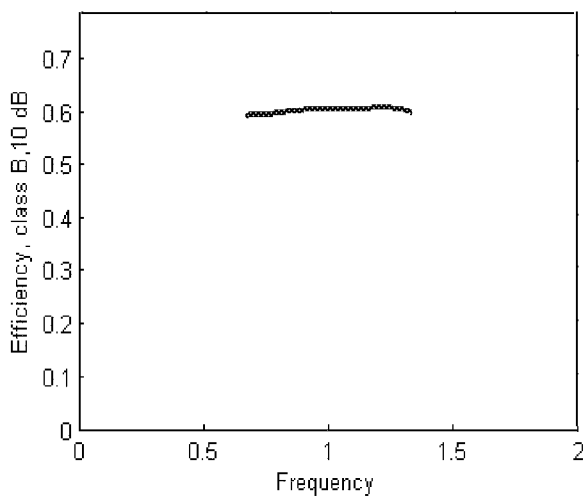
Figure 9D:
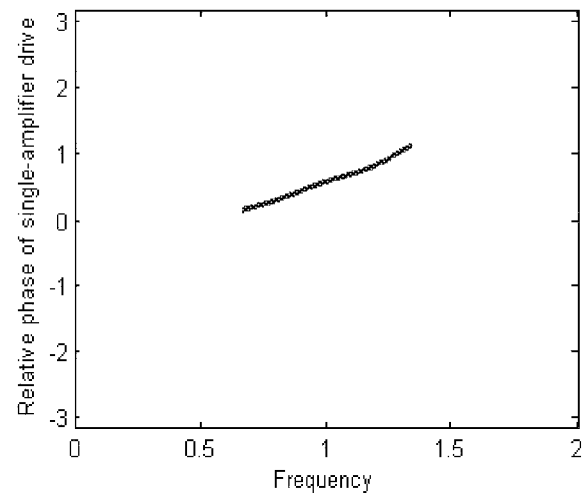

FIG. 9b shows the variation in transition point amplitude, FIG. 9c the efficiency at the transition point peaks and FIG. 9d the required relative phase angle variation for the embodiment of FIG. 9a.

It is noted that the relative phase movement with frequency of the single driving of the main amplifier $10_2$ (i.e. below the transition point) increases. This can be compensated, for example using the techniques outlined in co-pending patent number WO2016/056951.

A further consideration is that the voltage of any of the peaking sub-amplifiers ($10_1$, $10_3$ to $10_N$) in response to the driven (main) sub-amplifier $10_2$ may be held below a certain limit, often determined by breakdown. This may be a factor that determines a frequency limit of the amplifier. The simple way to express this is that the transimpedance magnitude from the main amplifier $10_2$ to any of the peaking amplifiers ($10_1$, $10_3$ to $10_N$) should not be higher than the self-impedance at the main amplifier (over the entire bandwidth).

It is noted that the embodiments of the invention are scalable to arbitrarily wide bandwidths and arbitrarily low ripple in the transition point amplitude by increasing the number of peaking amplifier stages. The embodiments of the invention may also be adapted to include more stages in order to provide lower transition points.

Figure 10A:
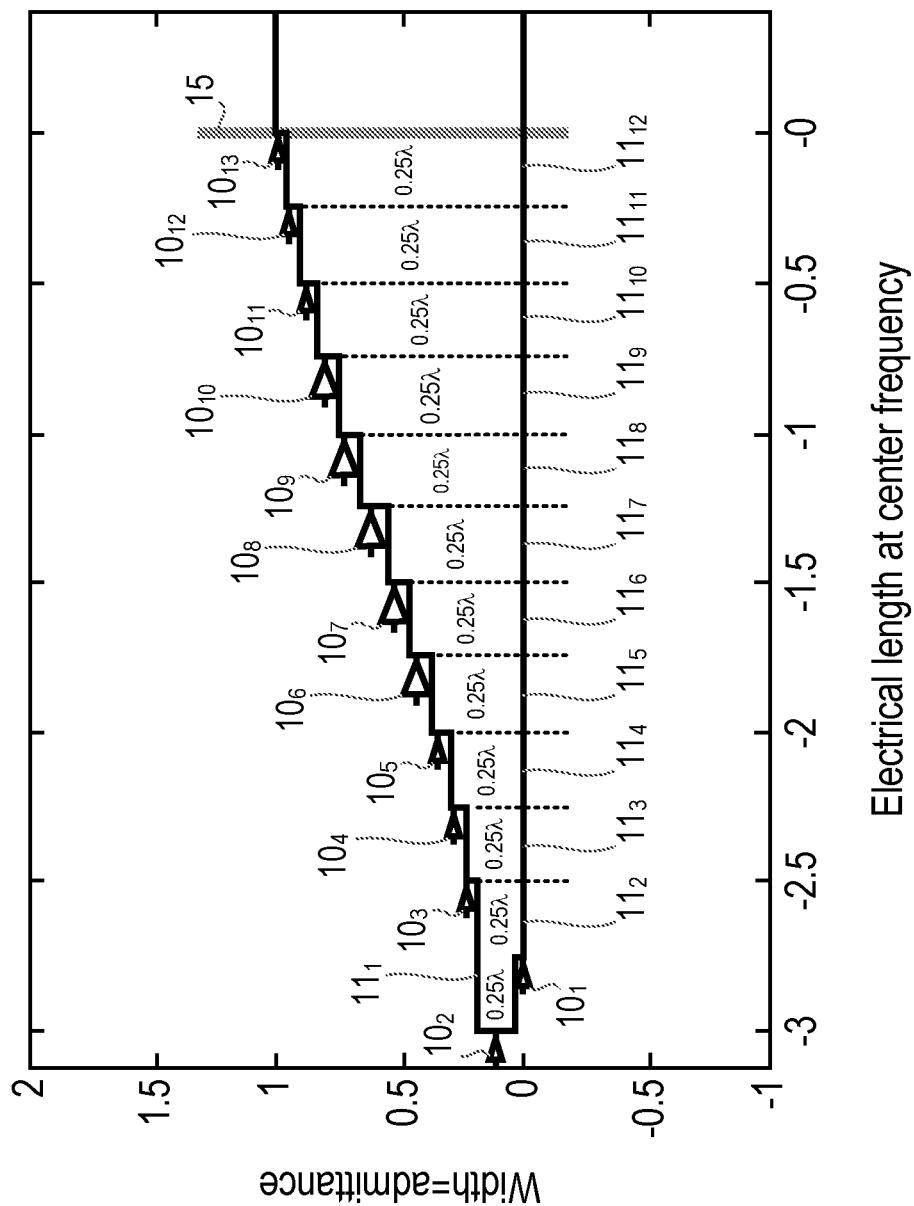
FIG. 10a shows an example of an amplifier arrangement according to another embodiment.

FIG. 10a shows an example of an amplifier arrangement according to another embodiment, and in particular a 13-stage amplifier designed for a 4:1 bandwidth (2 octaves) and very low ripple.

The amplifier arrangement of FIG. 10a comprises thirteen amplifier stages $10_1$ to $10_{13}$. The amplifier arrangement comprises a cascade of quarter wavelength transmission lines $11_1$ to $11_{12}$ coupled between an output of one of the thirteen sub-amplifiers or amplifier stages ($10_2$ in this example, also referred to as the "main" amplifier) and an output node 15 of the amplifier arrangement.

One amplifier, for example the last amplifier stage, also known as the last peaking amplifier (i.e. the thirteenth amplifier stage $10_{13}$ of this example) is coupled to the output node 15. The output of the main amplifier (i.e. the second amplifier stage $10_2$ of this example) is coupled to the input of first section $11_1$ of the cascade of quarter wavelength transmission lines. The remaining peaking amplifiers, (i.e. the peaking amplifiers $10_1$ and $10_3$ to $10_{12}$ in this example) are coupled to respective junctions in the cascade of quarter wavelength transmission lines $11_1$ to $11_{12}$.

The optimal load resistance for the main sub-amplifier $10_2$ is in this case R=6.84 times the common load (not shown in FIG. 10a because of size constraints). The peaking amplifiers $10_1$ and $10_3$ to $10_{13}$ have optimal load resistances of R1=27.2, R3=20.8, R4=16.2, R5=13.4, R6=11.5, R7=10.4, R8=10.0, R9=10.3, R10=11.7, R11=14.0, R12=18.5 and R13=24.1 times the common load, respectively. It is noted that these values are examples only for a particular design application.

Figure 10B:
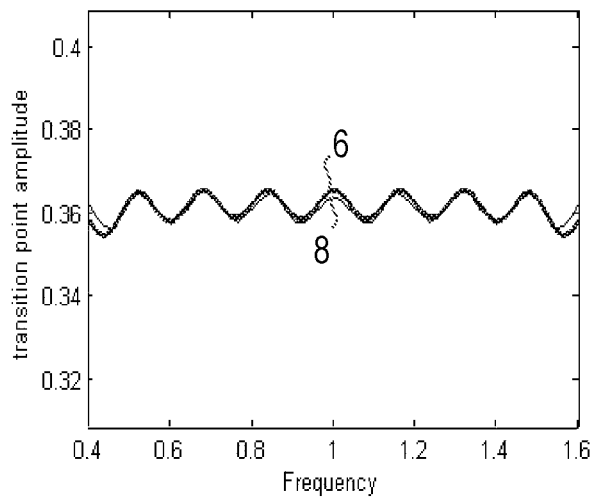
Figure 10C:
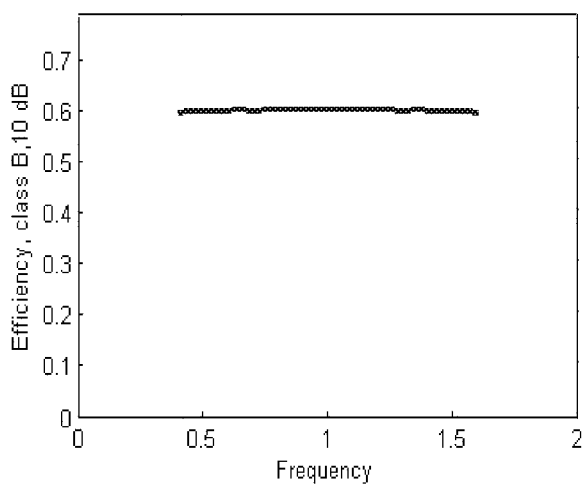
Figure 10D:
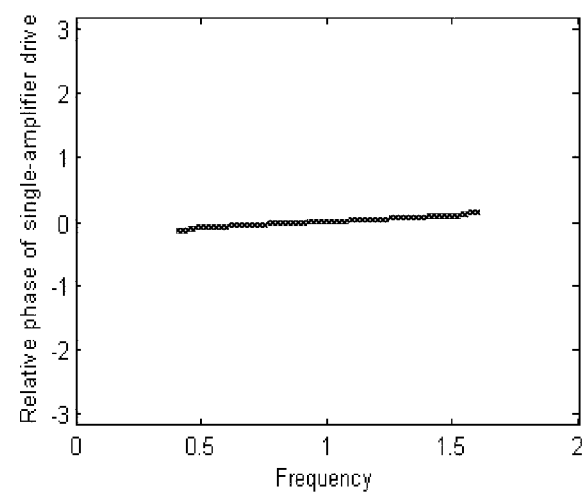

FIG. 10b shows the variation in transition point amplitude, FIG. 10c the efficiency at the transition point peaks and FIG. 10d the required relative phase angle variation for the arrangement of FIG. 10a.

Figure 11A:
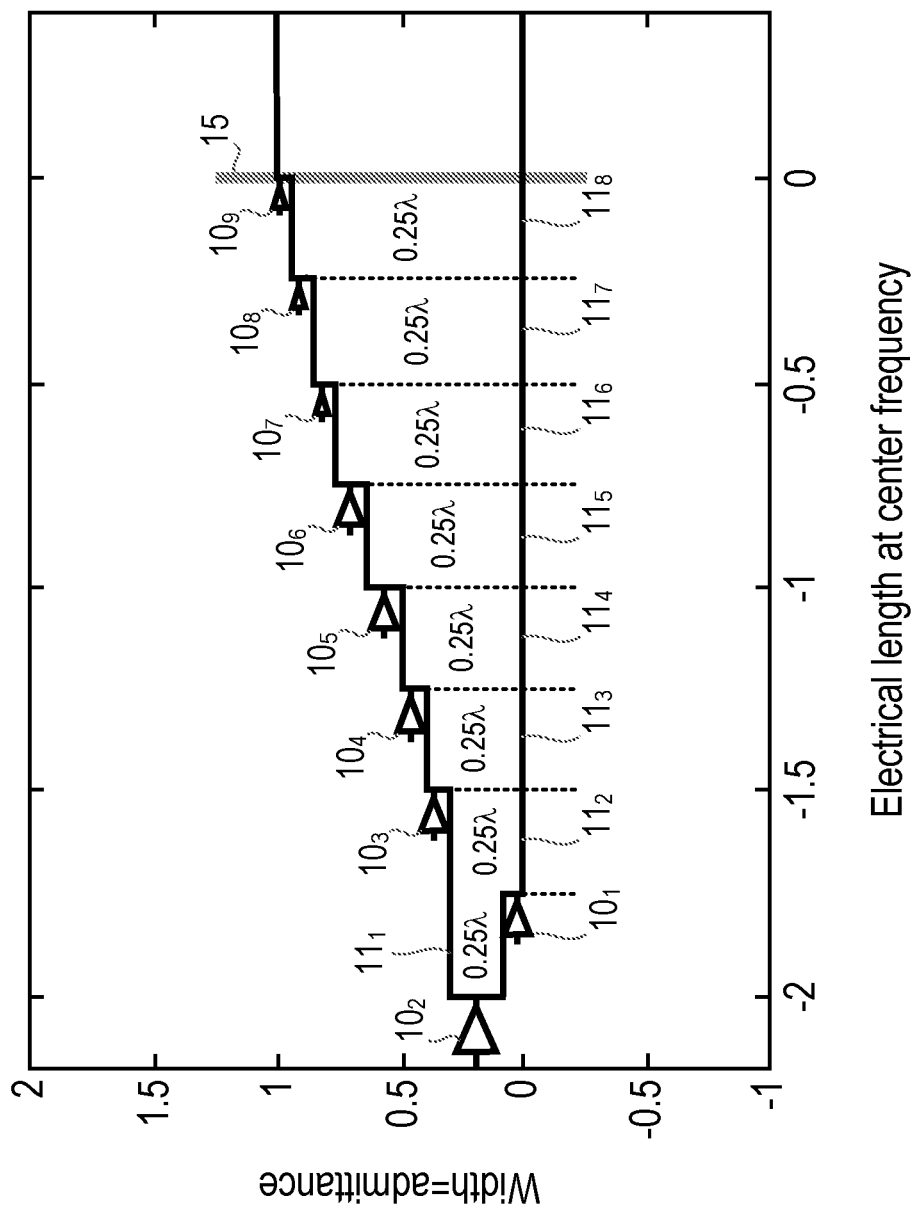
FIG. 11a shows an example of an amplifier arrangement according to another embodiment.

FIG. 11a shows an example of an amplifier arrangement according to another embodiment, and in particular an example of a 9-stage amplifier designed for a 8:1 bandwidth (3 octaves) and 7 dB PAR (i.e. a higher transition point amplitude than in the previous examples).

The amplifier arrangement of FIG. 11a comprises nine amplifier stages $10_1$ to $10_9$. The amplifier arrangement comprises a cascade of quarter wavelength transmission lines $11_1$ to $11_8$ coupled between an output of one of the nine sub-amplifiers or amplifier stages ($10_2$ in this example, also referred to as the "main" amplifier) and an output node 15 of the amplifier arrangement.

One amplifier, for example the last amplifier stage, also known as the last peaking amplifier (i.e. the ninth amplifier stage $10_9$ of this example) is coupled to the output node 15. The output of the main amplifier (i.e. the second amplifier stage $10_2$ of this example) is coupled to the input of first section $11_1$ of the cascade of quarter wavelength transmission lines. The remaining peaking amplifiers, (i.e. the peaking amplifiers $10_1$ and $10_3$ to $10_8$ in this example) are coupled to respective junctions in the cascade of quarter wavelength transmission lines $11_1$ to $11_8$.

The optimal load resistance for the main sub-amplifier $10_2$ is in this case R=4.42 times the common load (not shown because of size constraints). The peaking amplifiers $10_1$ and $10_3$ to $10_9$ have optimal load resistances of R1=14.1, R3=10.5, R4=9.01, R5=8.21, R6=7.94, R7=10.7, R8=11.4 and R9=14.7 times the common load, respectively. It is noted that these values are examples only for a particular design application.

Figure 11B:
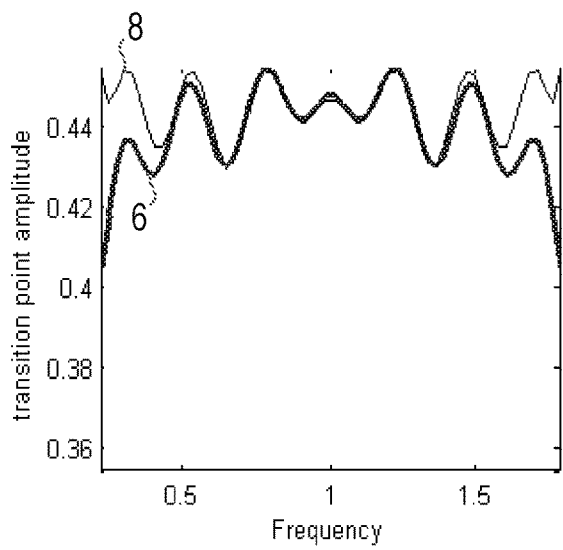
Figure 11C:
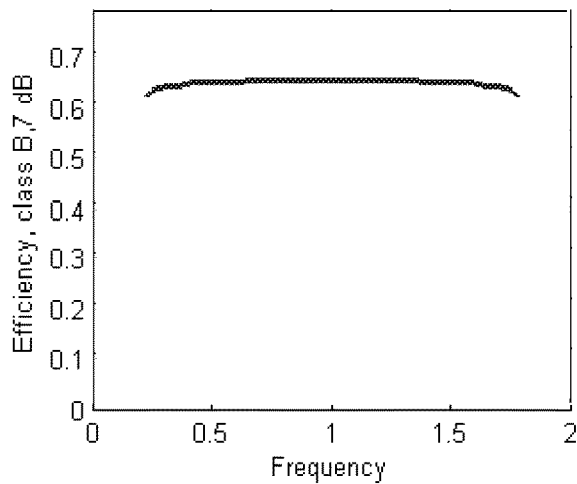
Figure 11D:
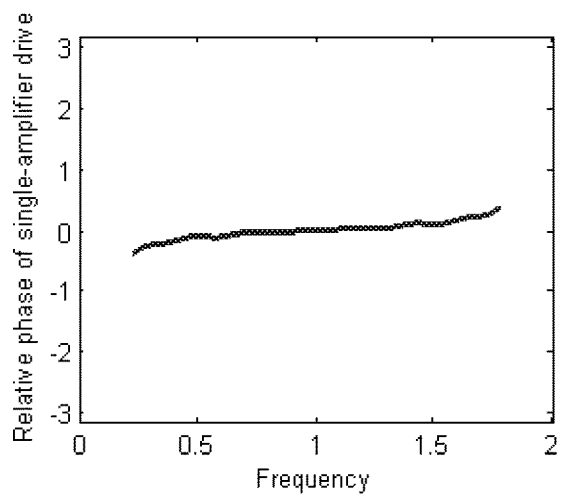

FIG. 11b shows the variation in transition point amplitude, FIG. 11c the efficiency at the transition point peaks and FIG. 11d the required relative phase angle variation for the embodiment of FIG. 11a.

It is noted that, according to the embodiments of the invention, the higher the numbers of peaking transistors used, then the better the performance when reduced sets of transistor sizes are used.

Figure 12A:
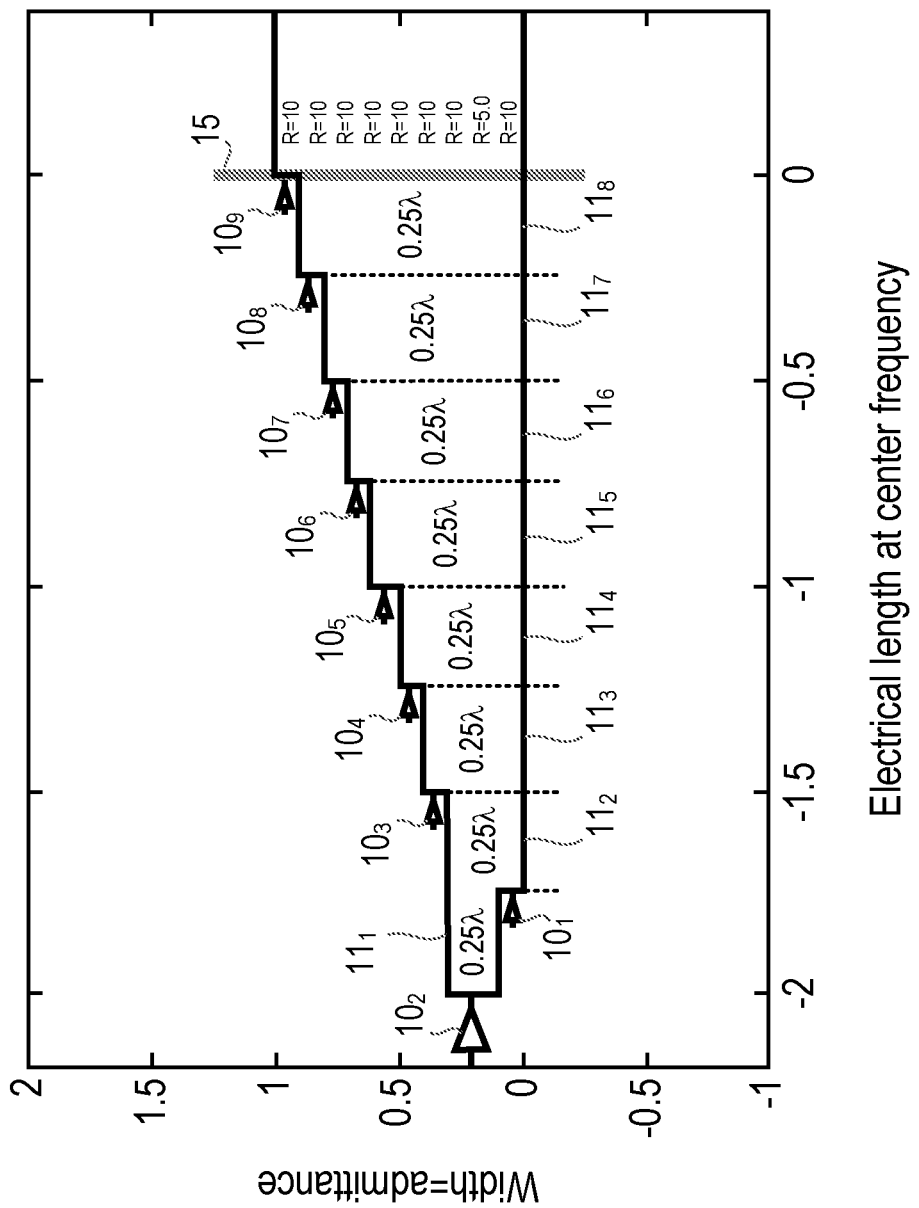
FIG. 12a shows an example of an amplifier arrangement according to another embodiment.

A version with only two transistor sizes (all peaking amplifiers the same size and double that size for the main amplifier) is shown in example of the embodiment of FIG. 12a.

The amplifier arrangement of FIG. 12a comprises nine amplifier stages $10_1$ to $10_9$. The amplifier arrangement comprises a cascade of quarter wavelength transmission lines $11_1$ to $11_8$ coupled between an output of one of the nine sub-amplifiers or amplifier stages ($10_2$ in this example, also referred to as the "main" amplifier) and an output node 15 of the amplifier arrangement.

One amplifier, for example the last amplifier stage, also known as the last peaking amplifier (i.e. the ninth amplifier stage $10_9$ of this example) is coupled to the output node 15. The output of the main amplifier (i.e. the second amplifier stage $10_2$ of this example) is coupled to the input of first section $11_1$ of the cascade of quarter wavelength transmission lines. The remaining peaking amplifiers, (i.e. the peaking amplifiers $10_1$ and $10_3$ to $10_8$ in this example) are coupled to respective junctions in the cascade of quarter wavelength transmission lines $11_1$ to $11_8$.

Figure 12B:
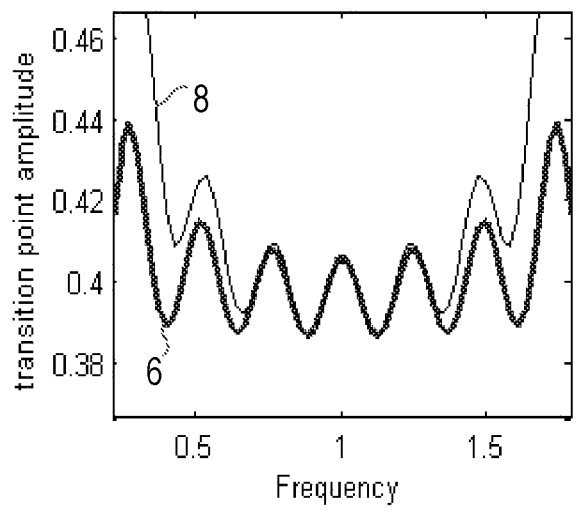
Figure 12C:
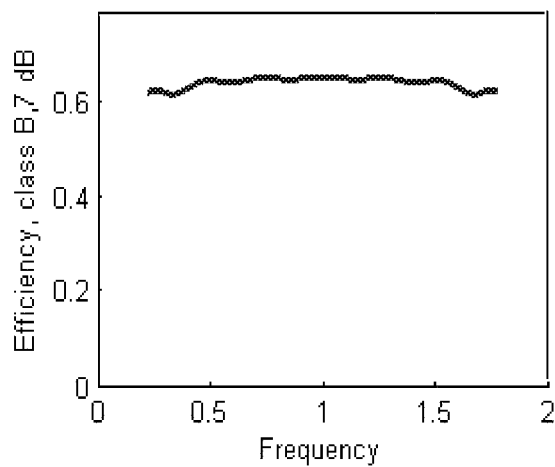
Figure 12D:
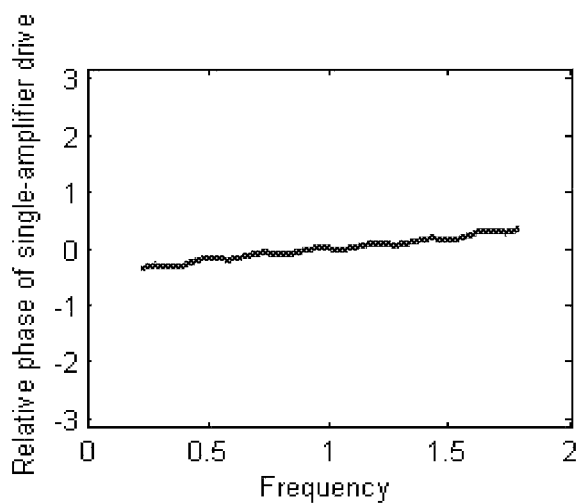

As can be seen from FIGS. 12b, 12c and 12d, the transition point amplitude and ripple deviates a little from the amplifier with optimized sizes in the previous example of FIG. 11a, but the effect on average efficiency over the three octave bandwidth is small.

It is noted that the shape of the ripple can also be tailored to be some function in frequency that can be obtained with simple circuitry on the input side. This can sometimes enable an amplifier with a lower number of stages to meet a certain specification, without compromising the simplicity much.

Figure 13A:
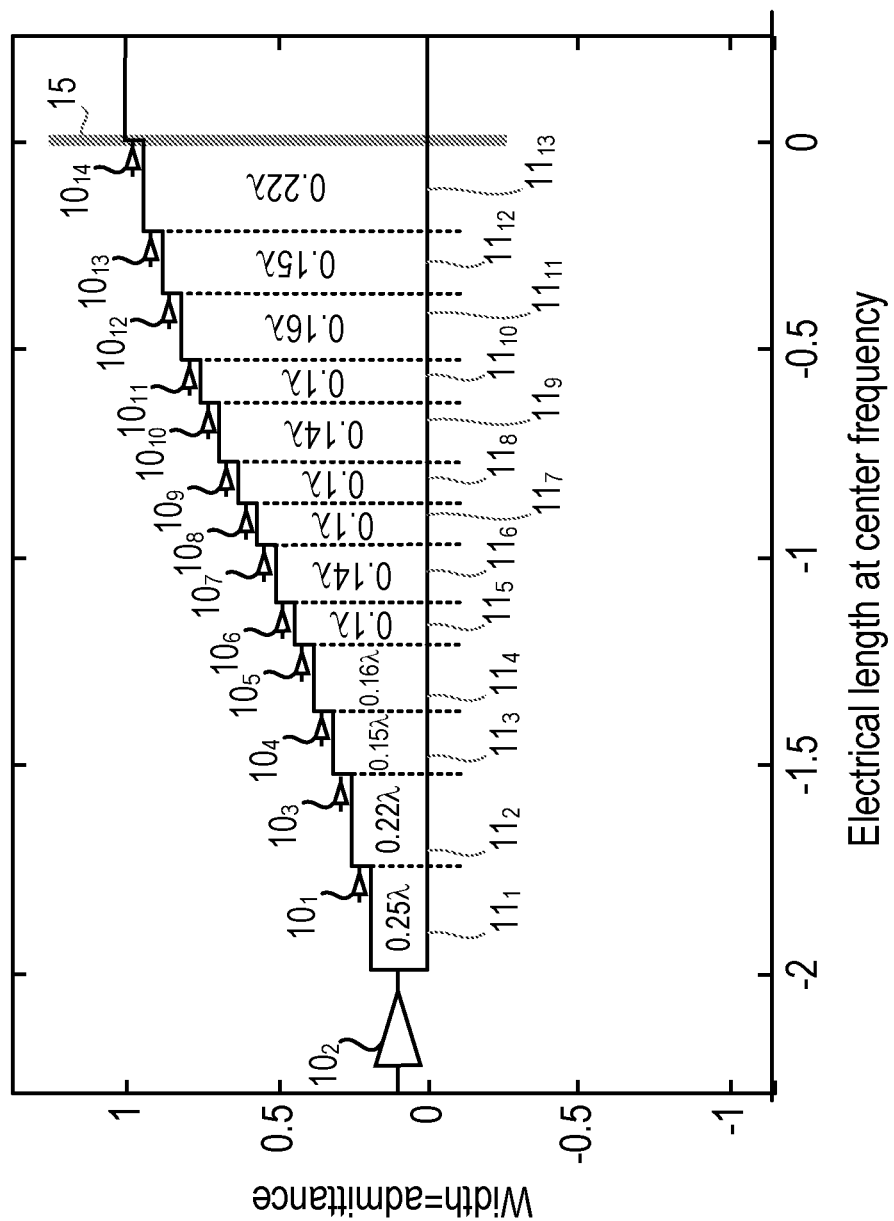
FIG. 13a shows an example of an amplifier arrangement according to another embodiment.

FIG. 13a shows an example of an amplifier arrangement according to another embodiment. The embodiment of FIG. 13a shows a variant in which the electrical lengths are used for obtaining the impedance variation profile, with unit amplifiers (for example a third of the size of the main amplifier $10_2$) provided for the peaking amplifiers. For example, the section $11_1$ of the cascade of transmission lines is shown as having an electrical length of $0.25\lambda$, section $11_2$ an electrical length of $0.22\lambda$, section $11_3$ an electrical length of $0.15\lambda$, and so forth as shown in the example of FIG. 13a.

According to such an embodiment each of the plurality of peaking amplifiers is of substantially equal size, and wherein the plurality of peaking amplifiers are distributed by varying electrical lengths along the cascade of transmission lines. Each section of the cascade of transmission lines can therefore have an electrical length which is selected to provide a desired impedance variation profile.

An amplifier arrangement may therefore be provided in which each of the plurality of peaking amplifiers is of substantially equal size, each corresponding section of the cascade of transmission lines comprises substantially equal admittance steps, and the electrical length of each corresponding section of the cascade of transmission lines is varied to obtain a desired impedance variation profile.

Figure 13B:
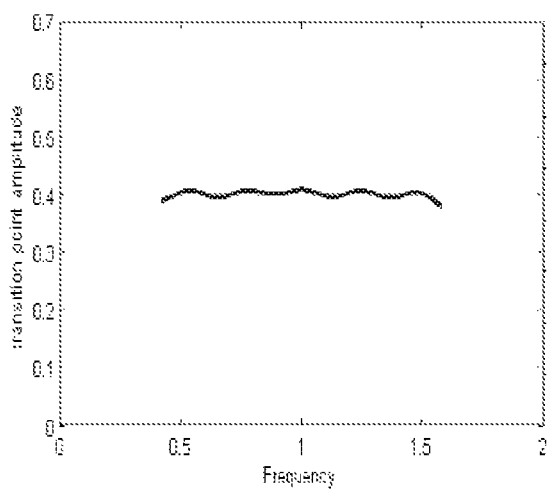
Figure 13C:
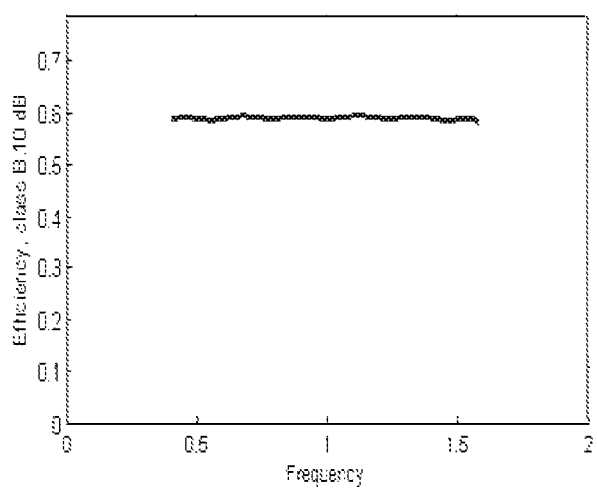
Figure 13D:
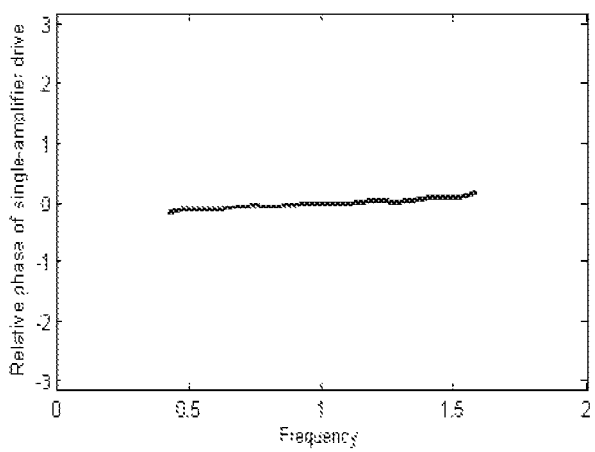

FIG. 13b shows the variation in transition point amplitude, FIG. 13c the efficiency at the transition point peaks and FIG. 13d the required relative phase angle variation for the embodiment of FIG. 13a.

From the embodiments described above it can be seen that some embodiments use different sized peaking amplifiers which are distributed using equal electrical lengths in the cascade of transmission lines, while other embodiments use equal sized peaking amplifiers which are distributed using unequal electrical lengths in the cascade of transmission lines, while other embodiments use a combination of these features.

According to an embodiment, there is provided an amplifier arrangement comprising: N amplifier stages comprising a main amplifier stage and a plurality of peaking amplifier stages; a cascade of transmission lines coupled between the N amplifier stages and an output node of the amplifier arrangement; wherein two or more of the peaking amplifiers are driven, during use, by time-delayed versions of the same signal; and wherein at least one of an amplifier size, an impedance of a transmission line in the cascade of transmission lines, or an electrical length of a transmission line in the cascade of transmission lines is varied to provide a desired impedance variation profile.

A high efficiency may be provided by the embodiments of the invention by using high-efficiency waveforms, for example class B or class F. For amplifiers with very large bandwidths, the amplifier configurations may be adapted to facilitate this, for example by providing push-pull coupled amplifiers. In such an example, an embodiment may be implemented fully differentially, so that a balun is only used at the output. It is noted that other implementations are also feasible without departing from the invention as defined in the appended claims, and the specific circuit techniques used may be defined by the bandwidth and other requirements that a specific to a particular application.

The embodiments of the invention provide a universal method to construct arbitrarily wideband amplifiers, for example wideband Doherty amplifiers with high efficiency. These amplifiers have consistent properties over large bandwidths, which simplifies implementation of the control and drive circuits. The embodiments have the advantage of enabling simple static gain and bias settings can be used.

The tradeoff between transition point ripple or droop and bandwidth can be improved, if desired, by increasing the number of collectively driven peaking amplifiers, and hence the number of quarter wavelength transmission lines. The embodiments of the invention have the advantage of being able to be implemented with small sets of transistor sizes.

The simplicity of the amplifier is not compromised by increasing the number of peaking amplifiers, since the drive signal and control can be the same for all peaking amplifiers, except an implemented difference in timing.

In one example, at least two or more of the peaking amplifiers is driven by a signal having substantially the same amplitude function. For example, each of the at least two or more peaking amplifiers may be driven, during use, by a class C signal, or shaped by other means.

In one example the amplifier arrangement is configured to only bias the peaking amplifiers in class C mode. In another example, the amplifier arrangement is configured to shape the main amplifier signal.

In one embodiment at least two signals are shaped differently prior to amplification, and wherein respective amplifier stages are biased differently to cater for the at least two differently shaped signals.

A transimpedance magnitude from the main amplifier to a peaking amplifier, over the bandwidth of operation, may be configured to be equal or less than the self-impedance at the main amplifier.

In the embodiments described above, it is noted that a characteristic impedance of a transmission line (for example of the main cascade of quarter wavelength transmission lines, or of the half wavelength transmission lines) is represented by the relative thicknesses of the transmission lines (the smaller the thickness the higher the characteristic impedance, and vice versa, which are labelled "R" in the various diagrams).

The amplifier arrangements described in the embodiments herein may be used in any application or apparatus, including for example an user equipment of a communication system, or a network node in a communication system.

In the examples described above, it is noted that a reference to a varying impedance line may also comprise an impedance line in which the impedance is continuously varied, rather than varied in steps as disclosed in some of the examples. Furthermore, it is noted that a varying impedance line may achieve an impedance variation using more steps, but smaller steps, without the need to have a peaking amplifier at all the steps. In one example, the peaking amplifiers are effectively distributed to cover the admittance increase between their connection points along the impedance line.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An amplifier arrangement comprising:
   N amplifier stages comprising a main amplifier stage and a plurality of peaking amplifier stages;
   a transmission line comprising a varying impedance for transforming a load impedance to a higher impedance at the main amplifier stage, wherein the plurality of peaking amplifiers are coupled at intermediate locations to the transmission line; and
   wherein the amplifier arrangement is configured such that at least two of the peaking amplifiers are collectively driven with time delayed versions of substantially the same signal,
   wherein the transmission line comprises a cascade of transmission lines coupled between the N amplifier stages and an output node of the amplifier arrangement,
   wherein the amplifier arrangement is configured to operate in a Doherty mode of operation, and
   wherein one line of the cascade closer to the input side of the cascade is shortened by a greater amount compared to another line of the cascade closer to the output side of the cascade.

2. An amplifier arrangement as claimed in claim 1, wherein the amplifier arrangement is configured to comprise N−2 or fewer transition points.

3. An amplifier arrangement as claimed in claim 1, wherein the plurality of peaking amplifiers are distributed by varying electrical lengths along the cascade of transmission lines.

4. An amplifier arrangement as claimed in claim 1, wherein the number of peaking amplifiers is increased compared to the number of peaking amplifiers in a Doherty amplifier configured to have the same number of transition points.

5. An amplifier arrangement as claimed in claim 1, wherein the size of each amplifier stage is selected to have an optimal load resistance matched to an admittance step in a corresponding junction between transmission line segments.

6. An amplifier arrangement as claimed in claim 1, wherein a transmission line connecting each amplifier to a junction between transmission line segments has a characteristic impedance matched to the admittance step in a corresponding junction between transmission line segments.

7. An amplifier arrangement as claimed in claim 1, wherein the impedances of the cascade of transmission lines are configured to optimize the bandwidth of low ripple in a transimpedance from the main amplifier to a load.

8. An amplifier arrangement as claimed in claim 1, wherein the transmission line comprises:
   a cascade of quarter wavelength transmission lines coupled between an output of the main amplifier of the N amplifier stages and an output node of the amplifier arrangement, wherein the cascade comprises N−1 quarter wavelength transmission lines; and wherein
   an output of a first peaking amplifier of the N amplifier stages is coupled to the output node, and remaining peaking amplifiers of the N amplifier stages coupled to respective junctions in the cascade of quarter wavelength transmission lines.

9. An amplifier arrangement as claimed in claim 1 wherein, during use, at least two or more of the peaking amplifiers is driven by a signal having substantially the same amplitude function.

10. A method in an amplifier arrangement comprising N amplifier stages, comprising a main amplifier stage and a plurality of peaking amplifier stages, and a transmission line comprising a varying impedance for transforming a load impedance to a higher impedance at the main amplifier stage, and wherein the plurality of peaking amplifiers are coupled at intermediate locations to the transmission line, the method comprising:
- collectively driving at least two of the peaking amplifiers with time delayed versions of substantially the same signal,
- wherein the transmission line comprises a cascade of transmission lines coupled between the N amplifier stages and an output node of the amplifier arrangement,
- wherein the method comprises operating the amplifier arrangement in a Doherty mode of operation, and
- wherein one line of the cascade closer to the input side of the cascade is shortened by a greater amount compared to another line of the cascade closer to the output side of the cascade.

11. A method as claimed in claim 10, wherein the amplifier arrangement is driven such that the amplifier arrangement comprises N−2 or fewer transition points.

12. A method as claimed in claim 10, further comprising distributing the plurality of peaking amplifiers by varying electrical lengths along the cascade of transmission lines.

13. A method as claimed in claim 10, further comprising selecting the size of each amplifier stage to have an optimal load resistance matched to an admittance step in a corresponding junction between transmission line segments.

14. A method as claimed in claim 10, wherein a transmission line connecting each amplifier to a junction between transmission line segments has a characteristic impedance matched to the admittance step in a corresponding junction between transmission line segments.

* * * * *